(12) United States Patent
Park et al.

(10) Patent No.: US 12,250,801 B2
(45) Date of Patent: Mar. 11, 2025

(54) ELECTROMAGNETIC WAVE-ABSORBING COMPOSITE MATERIAL COMPRISING CONDUCTIVE WIRE AND MANUFACTURING METHOD THEREFOR

(71) Applicant: KOREA INSTITUTE OF MATERIALS SCIENCE, Changwon-si (KR)

(72) Inventors: Byeong Jin Park, Changwon-si (KR); Tae Hoon Kim, Changwon-si (KR); Sang Bok Lee, Changwon-si (KR); Byung Mun Jung, Changwon-si (KR); Seung Han Ryu, Changwon-si (KR); Yu Kyung Han, Changwon-si (KR); Suk Jin Kwon, Changwon-si (KR)

(73) Assignee: KOREA INSTITUTE OF MATERIALS SCIENCE, Changwon-si (KR)

( * ) Notice: Subject to any disclaimer, the term of this patent is extended or adjusted under 35 U.S.C. 154(b) by 0 days.

(21) Appl. No.: 18/284,720

(22) PCT Filed: Aug. 2, 2022

(86) PCT No.: PCT/KR2022/011360
§ 371 (c)(1),
(2) Date: Sep. 28, 2023

(87) PCT Pub. No.: WO2023/027367
PCT Pub. Date: Mar. 2, 2023

(65) Prior Publication Data
US 2024/0196581 A1    Jun. 13, 2024

(30) Foreign Application Priority Data
Aug. 24, 2021   (KR) .................. 10-2021-0111859

(51) Int. Cl.
*H05K 9/00* (2006.01)
*H01Q 17/00* (2006.01)

(52) U.S. Cl.
CPC ........... *H05K 9/009* (2013.01); *H01Q 17/005* (2013.01)

(58) Field of Classification Search
CPC .......................... H01Q 17/005; H05K 9/009
See application file for complete search history.

(56) References Cited

U.S. PATENT DOCUMENTS 5,976,666 A * 11/1999 Narang ................. H01Q 17/00
                                                         428/137
7,960,029 B2    4/2011 Kai et al.
(Continued)

FOREIGN PATENT DOCUMENTS

JP    2003-298278 A    10/2003
JP    2012-080091 A    4/2012
(Continued)

OTHER PUBLICATIONS

International Search Report for PCT/KR2022/011360, dated Nov. 18, 2022.

*Primary Examiner* — Hung V Ngo
(74) *Attorney, Agent, or Firm* — Sughrue Mion, PLLC

(57) ABSTRACT

The present invention provides an electromagnetic wave-absorbing composite material and a manufacturing method therefor, the electromagnetic wave-absorbing composite material comprising: a polymer composite including a refractive index-adjusting material therein; and a plurality of conductive wires formed on at least one surface of the polymer composite, wherein electromagnetic waves reflected in a matching frequency (f) range derived through Mathematical Formulas 1 to 3 described in the present invention are 0.2 dB or less.

18 Claims, 18 Drawing Sheets

(56) References Cited

U.S. PATENT DOCUMENTS

| | | | |
|---|---|---|---|
| 2011/0192643 A1* | 8/2011 | Marin Palacios | F41H 3/00 |
| | | | 174/377 |
| 2018/0354242 A1* | 12/2018 | Hashimoto | B32B 15/18 |
| 2020/0413578 A1* | 12/2020 | Toyoda | B32B 7/12 |
| 2022/0046836 A1* | 2/2022 | Guo | H05K 9/0094 |

FOREIGN PATENT DOCUMENTS

| | | |
|---|---|---|
| KR | 10-1066074 B1 | 9/2011 |
| KR | 10-2015-0043087 A | 4/2015 |
| KR | 10-2015-0077238 A | 7/2015 |
| KR | 10-2021-0103413 A | 8/2021 |

* cited by examiner

ND MANUFACTURING METHOD THEREFOR

ELECTROMAGNETIC WAVE-ABSORBING COMPOSITE MATERIAL COMPRISING CONDUCTIVE WIRE AND MANUFACTURING METHOD THEREFOR

CROSS REFERENCE TO RELATED APPLICATIONS

This application is a National Stage of International Application No. PCT/KR2022/011360 filed Aug. 2, 2022, claiming priority based on Korean Patent Application No. 10-2021-0111859 filed Aug. 24, 2021, the entire disclosures of which are incorporated herein by reference.

TECHNICAL FIELD

The present invention relates to the structure design of an electromagnetic wave-absorbing composite material that can derive relationship formulas that can identify and design the organic relationship between the thickness and refractive index of the polymer composite and the specifications of the conductive wires (line width, spacing, etc.) to maximize electromagnetic wave absorption capacity in the target matching frequency band, and at the same time, it can derive the optimal conditions to maximize the electromagnetic wave absorption capacity that is incident at the set matching frequency, thereby minimizing the electromagnetic interference between electronic components that are trending toward miniaturization and thinning, and to an electromagnetic wave-absorbing composite material that is implemented therefrom.

BACKGROUND ART

Recently, with the development of electric and electronic components and next-generation information and communication devices, the operating frequency of circuits is increasing to a high frequency band of GHz (gigahertz). In particular, as devices become multifunctional and miniaturized, minute electromagnetic waves that are generated from general electronic components can cause malfunctions due to electromagnetic interference between the electronic components, and the problems of harmful electromagnetic waves to the human body and electromagnetic wave pollution due to the deterioration of signal quality and the emission of electromagnetic waves are emerging as serious issues.

In order to solve problems caused by the generation of electromagnetic waves and improve the stability of electronic components, research on electromagnetic wave-shielding materials that absorb and shield electromagnetic waves is being conducted. However, the above existing electromagnetic wave-shielding materials have the following problems.

First, the methods of dispersing magnetic materials in shielding materials have been introduced to exhibit excellent electromagnetic wave absorption capacity, but most magnetic materials have a problem in that magnetic permeability is almost lost in the GHz band because resonance occurs by high frequencies. In addition, since the magnetic materials have a directionality of magnetic spin, it is difficult to fine-tune the electromagnetic wave energy absorption according to the complex design of a device or circuit. Furthermore, when a large amount of magnetic materials is dispersed, the electromagnetic wave absorption effect can be increased by improving the electrical conductivity, but it causes a deterioration in the mechanical properties of electronic components, including impact strength, and the application thereof as an electromagnetic wave-shielding material is subject to many limitations.

Second, multi-layered electromagnetic shielding materials have been introduced that absorb and shield electromagnetic waves even in the GHz band as described above and have little deterioration in the mechanical and electrical properties, but due to the thickness of the multi-layered structure, it is difficult to use the same in electronic components that are on the trend of miniaturization/thinning, and furthermore, the multi-layered structure of the electromagnetic wave-shielding materials does not efficiently control the incident electromagnetic wave energy in the process of converting the same into heat, and rather causes problems in which the electronic components malfunction.

Third, in the past, research has been conducted on electromagnetic wave-shielding materials in which a conductive wire is formed on at least one surface of a composite, but it is difficult to identify and control the organic relationship between components constituting the composite according to the target frequency. That is, generally, in order to absorb a specific frequency, the fine control of complex physical properties such as the refractive index, thickness, material and dispersed metal material of the electromagnetic shielding material is required, and thus, in order to absorb electromagnetic waves in the GHz frequency band as required by 5G and provide efficient electromagnetic shielding materials, structural design for absorbing materials that are capable of absorbing a specific frequency (5G band) is essentially required along with structural design for maximizing the electromagnetic wave absorption capacity. However, there is no research on efficiently absorbing and shielding electromagnetic waves while having the GHz matching frequency as required by 5G.

Accordingly, in order to maximize the electromagnetic wave absorption capacity in the target matching frequency band, research on the structure design of an electromagnetic wave-absorbing composite material that can derive relationship formulas that can identify and design the organic relationship between the thickness and refractive index of the polymer composite and the specifications of the conductive wires (line width, spacing, etc.) to maximize electromagnetic wave absorption capacity in the target matching frequency band, and at the same time, it can derive the optimal conditions to maximize the electromagnetic wave absorption capacity that is incident at the set matching frequency, thereby minimizing the electromagnetic interference between electronic components that are trending toward miniaturization and thinning, and an electromagnetic wave-absorbing composite material that is implemented therefrom.

DISCLOSURE

Technical Problem

The present invention has been devised to overcome the above-described problems.

The first problem to be solved by the present invention is to provide an electromagnetic wave-absorbing composite material that can absorb most of the electromagnetic waves in a specific frequency band by being used in a device that emits electromagnetic waves and has an electromagnetic wave reflectivity close to 0 dB, and a manufacturing method therefor.

In addition, the second problem to be solved by the present invention is to provide an electromagnetic wave-absorbing composite material that is capable of maximizing electromagnetic wave absorption capacity and minimizing electromagnetic wave reflectivity at the same time for the efficient shielding of electromagnetic waves in a target frequency range, and a manufacturing method therefor.

In addition, the third problem to be solved by the present invention is to provide an electromagnetic wave-absorbing composite material having an overall low reflectivity in a wide frequency band, and a manufacturing method therefor.

In addition, the fourth problem to be solved by the present invention is to design the structure of an electromagnetic wave-absorbing composite material that can derive relationship formulas that can identify and design the organic relationship between the thickness and refractive index of the polymer composite and the specifications of the conductive wires (line width, spacing, etc.) to maximize electromagnetic wave absorption capacity in the target matching frequency band, and at the same time, it can derive the optimal conditions to maximize the electromagnetic wave absorption capacity that is incident at the set matching frequency, thereby minimizing the electromagnetic interference between electronic components that are trending toward miniaturization and thinning, and to provide an electromagnetic wave-absorbing composite material that is implemented therefrom.

Technical Solution

In order to solve the above-described problems, the present invention provides an electromagnetic wave-absorbing composite material, including a polymer composite including a refractive index-adjusting material therein; and a plurality of conductive wires which are formed on at least one surface of the polymer composite, wherein electromagnetic waves reflected in a matching frequency (f) range derived through Mathematical Formulas 1 to 3 below are 0.2 dB or less:

$$0.67 \frac{D_{eff}}{n_{eff} c} \leq f(GHz) \leq 0.83 \frac{D_{eff}}{n_{eff} c} \quad \text{[Mathematical Formula 1]}$$

wherein the lower limit of f is 15, and the upper limit thereof is a frequency of 80,
$D_{eff}$ is the effective spacing of conductive wires represented by Mathematical Formula 2 below,
$N_{eff}$ is the effective refractive index of an electromagnetic wave-shielding composite material represented by Mathematical Formula 3 below, and
c is the speed of light in free space, $$D_{eff}=1.53 \exp(0.23(D-a)) \quad \text{[Mathematical Formula 2]}$$

wherein D is the average spacing of the conductive wires, and
a is the average line width of the conductive wires, $$n_{eff} = \sqrt{1 - \frac{n^2-1}{n^2} \exp\left(\frac{-18d}{D}\right) n} \quad \text{[Mathematical Formula 3]}$$

wherein n is the average refractive index of the polymer composite,
D is the average spacing of the conductive wires, and
d is the thickness of the polymer composite.

In addition, according to an exemplary embodiment of the present invention, the average spacing (D) of the conductive wires may be 0.5 to 10 mm.

In addition, according to another exemplary embodiment of the present invention, the thickness (d) of the polymer composite may be 100 to 2,000 μm.

In addition, according to still another exemplary embodiment of the present invention, the average line width (a) of the conductive wires may be 50 to 500 μm.

In addition, according to an exemplary embodiment of the present invention, the electromagnetic wave-absorbing composite material may have an electromagnetic wave absorption rate of 80% or more.

In addition, according to another exemplary embodiment of the present invention, the refractive index-adjusting material may include at least one of a magnetic material, a metal material, a carbon material, a ceramic material and MXene.

In addition, according to still another exemplary embodiment of the present invention, the conductive wires may include at least one of a conductor which is an iron (Fe)-based metal, a cobalt (Co)-based metal, a nickel (Ni)-based metal, a molybdenum (Mo)-based metal, a manganese (Mn)-based metal, a neodymium (Nd)-based metal, a gold (Au)-based metal, a silver (Ag)-based metal, a copper (Cu)-based metal, an aluminum (Al)-based metal, a platinum (Pt)-based metal, a carbon nanotube, a carbon nanofiber, carbon black, a carbon fiber and graphene or a palladium (Pd)-based metal or an alloy thereof, and a conductive polymer which is MXene or polypyrrole, polyaniline, polyacetylene, polyparaphenylenevinylene, polythiophene, polyethylenedioxythiophene, polyphenylene sulfide or a combination thereof. In addition, according to an exemplary embodiment of the present invention, a plurality of the polymer composites may be laminated, and a conductive wire may be formed on the uppermost surface of the laminated polymer composite.

In addition, according to another exemplary embodiment of the present invention, the conductive wires may be in the form of a mesh, a circle, a polygon, a split ring or a complex shape including any one or more thereof.

In addition, according to an exemplary embodiment of the present invention, the conductive wires may be formed in multiple intervals or a single interval.

In addition, according to an exemplary embodiment of the present invention, when the conductive wires are formed in multiple intervals, the conductive wires may have a reflectance of 30% or less in frequency.

In addition, according to still another exemplary embodiment of the present invention, the electromagnetic wave-absorbing composite material may have an electromagnetic wave reflectance of 0.5 dB or less at a frequency of 26 GHz.

In addition, according to still another exemplary embodiment of the present invention, electromagnetic waves reflected in a matching frequency (f) range derived through Mathematical Formulas 1 to 3 above may be 0.1 dB or less.

In addition, the present invention provides an electromagnetic wave-absorbing circuit module, including a circuit board on which elements are mounted; and the above-described electromagnetic wave-absorbing composite material which is provided on the circuit board to cover at least one surface of the elements.

In addition, the present invention provides an electronic device, including the electromagnetic wave-absorbing circuit module.

In addition, the present invention provides a method for manufacturing an electromagnetic wave-absorbing composite material, including the steps of (1) preparing a polymer composite including a refractive index-adjusting material therein; and (2) forming a conductive wire on the polymer composite, wherein the average refractive index and thickness of the polymer composite and the line width and spacing of the conductive wires are controlled such that electromagnetic waves reflected in a matching frequency (f) range derived through Mathematical Formulas 1 to 3 below are 0.2 dB or less:

$$0.67 \frac{D_{eff}}{n_{eff}c} \leq f(\text{GHz}) \leq 0.83 \frac{D_{eff}}{n_{eff}c} \quad \text{[Mathematical Formula 1]}$$

wherein the lower limit of f is 15, and the upper limit thereof is a frequency of 80, $D_{eff}$ is the effective spacing of conductive wires represented by Mathematical Formula 2 below, $N_{eff}$ is the effective refractive index of an electromagnetic wave-shielding composite material represented by Mathematical Formula 3 below, and c is the speed of light in free space, $$D_{eff} = 1.53 \exp(0.23(D-a)) \quad \text{[Mathematical Formula 2]}$$

wherein D is the average spacing of the conductive wires, and a is the average line width of the conductive wires, $$n_{eff} = \sqrt{1 - \frac{n^2-1}{n^2}\exp\left(\frac{-18d}{D}\right)n} \quad \text{[Mathematical Formula 3]}$$

wherein n is the average refractive index of the polymer composite,

D is the average spacing of the conductive wires, and d is the thickness of the polymer composite.

Further, in the method for manufacturing an electromagnetic wave-absorbing composite material according to an exemplary embodiment of the present invention, the polymer composite in step (1) may further include a refractive index-adjusting material.

Further, in the method for manufacturing an electromagnetic wave-absorbing composite material according to another exemplary embodiment of the present invention, in step (1), a plurality of the polymer composites may be laminated, and in step (2), a conductive wire may be formed in the polymer composites that are laminated in step (1).

Further, in the method for manufacturing an electromagnetic wave-absorbing composite material according to still another exemplary embodiment of the present invention, step (2) may be a step of sewing on any one surface of the polymer composite by using the conductive wire which is at least one of a conductor which is an iron (Fe)-based metal, a cobalt (Co)-based metal, a nickel (Ni)-based metal, a molybdenum (Mo)-based metal, a manganese (Mn)-based metal, a neodymium (Nd)-based metal, a gold (Au)-based metal, a silver (Ag)-based metal, a copper (Cu)-based metal, an aluminum (Al)-based metal, a platinum (Pt)-based metal, a carbon nanotube, a carbon nanofiber, carbon black, a carbon fiber and graphene or a palladium (Pd)-based metal or an alloy thereof, and a conductive polymer which is MXene or polypyrrole, polyaniline, polyacetylene, polyparaphenylenevinylene, polythiophene, polyethylenedioxythiophene, polyphenylene sulfide or a combination thereof, and a mixture of fibers including at least one of a polyurethane-based fiber, a polyamide-based fiber, a polyester-based fiber, an acrylic-based fiber, a polyolefin-based fiber, a cellulose-based fiber, a carbon-based fiber and a glass fiber.

Advantageous Effects

According to the electromagnetic wave-absorbing composite material according to the present invention, it is used for electronic components that emit electromagnetic waves to absorb 90% or more of electromagnetic waves in a specific frequency band, and at the same time, it shows electromagnetic wave reflection close to 0 dB, thereby effectively shielding electromagnetic waves between electronic components such that it can contribute to miniaturization/thinning without the deterioration of mechanical and electrical properties of electronic components.

Furthermore, the electromagnetic wave-absorbing composite material according to the present invention can derive relationship formulas that can identify and design the organic relationship between the thickness and refractive index of the polymer composite and the specifications of the conductive wires (line width, spacing, etc.) to maximize electromagnetic wave absorption capacity in the target matching frequency band, and at the same time, it can derive the optimal conditions to maximize the electromagnetic wave absorption capacity that is incident at the set matching frequency. In addition, since it can be designed to have overall low reflectivity in a wide frequency range, the stability of electronic components can be improved by minimizing electromagnetic interference between electronic components, which are trending toward miniaturization and thinning.

BEST MODE

Hereinafter, the exemplary embodiments of the present invention will be described in detail so that those skilled in the art can easily practice the present invention. The present invention may be embodied in many different forms and is not limited to the exemplary embodiments set forth herein.

As described above, the conventional electromagnetic wave-shielding materials have problems in that they do not fit the trend of miniaturization/thinning of electronic components, it is difficult to design to have a specific matching frequency, and it is not possible to maximize the shielding ability by maximizing electromagnetic wave absorption capacity or minimizing reflectivity through structure design at a specific matching frequency.

Accordingly, the present invention has solved to solve the above-described problems by providing an electromagnetic wave-absorbing composite material, including a polymer composite including a refractive index-adjusting material therein; and a plurality of conductive wires which are formed on at least one surface of the polymer composite, wherein electromagnetic waves reflected in a matching frequency (f) range derived through Mathematical Formulas 1 to 3 below are 0.2 dB or less:

$$0.67 \frac{D_{eff}}{n_{eff} c} \leq f(\text{GHz}) \leq 0.83 \frac{D_{eff}}{n_{eff} c} \quad \text{[Mathematical Formula 1]}$$

wherein the lower limit of f is 15, and the upper limit thereof is a frequency of 80, $D_{eff}$ is the effective spacing of conductive wires represented by Mathematical Formula 2 below, $N_{eff}$ is the effective refractive index of an electromagnetic wave-shielding composite material represented by Mathematical Formula 3 below, and c is the speed of light in free space, $$D_{eff} = 1.53 \exp(0.23(D-a)) \quad \text{[Mathematical Formula 2]}$$

wherein D is the average spacing of the conductive wires, and a is the average line width of the conductive wires, $$n_{eff} = \sqrt{1 - \frac{n^2-1}{n^2} \exp\left(\frac{-18d}{D}\right) n} \quad \text{[Mathematical Formula 3]}$$

wherein n is the average refractive index of the polymer composite,

D is the average spacing of the conductive wires, and d is the thickness of the polymer composite.

Through this, the present invention can derive relationship formulas that can identify and design the organic relationship between the thickness and refractive index of the polymer composite and the specifications of the conductive wires (line width, spacing, etc.) to maximize electromagnetic wave absorption capacity in the target matching frequency band, and at the same time, it can derive the optimal conditions to maximize the electromagnetic wave absorption capacity that is incident at the set matching frequency, thereby minimizing the electromagnetic interference between electronic components so as to improve the stability of electronic components.

Figure 1:
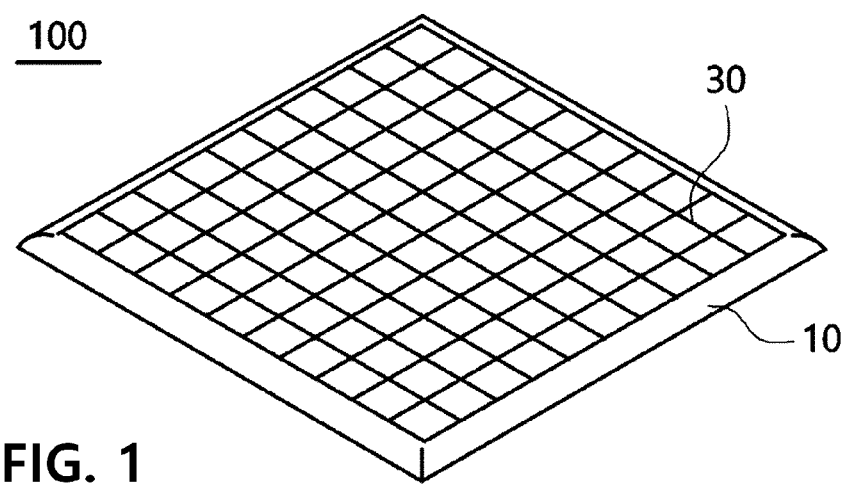
FIG. 1 is a diagram showing an electromagnetic wave-absorbing composite material according to the present invention.

FIG. 1 is a diagram showing an electromagnetic wave-absorbing composite material according to the present invention.

Specifically, referring to FIG. 1, the electromagnetic wave-absorbing composite material 100 according to the present invention includes a polymer composite 10 including a refractive index-adjusting material 20 therein.

The polymer composite 10 functions as a polymer substrate in which the refractive index-adjusting material 20 is dispersed therein and conductive wires are formed on at least one surface of the polymer composite 10, and at the same time, along with the refractive index-adjusting material 20 and the conductive wires 30, it is possible to set a specific matching frequency, and it is a major variable that must be controlled to maximize absorption capacity in a set frequency band.

That is, since the polymer composite 10 is one factor that determines the electromagnetic wave absorption capacity of the electromagnetic wave-absorbing composite material 100, the refractive index, thickness and material of the polymer composite 10 may be controlled to match the frequency, desired absorbing ability and reflectivity of the finally manufactured electromagnetic wave-absorbing composite material 100.

Referring to FIG. 2, the polymer composite 10 includes a refractive index-adjusting material 20.

In this case, the refractive index-adjusting material 20 may be a material that affects the refractive index in the present invention, but the present invention is not limited thereto, and it may also be a material that controls physical properties such as magnetic permeability and permittivity.

According to an exemplary embodiment of the present invention, when the refractive index-adjusting material controls the permittivity, the refractive index-adjusting material may have a permittivity of 3 to 15. In this case, if the permittivity is less than 3, there may be a problem of not achieving the desired absorption capacity, and if the permittivity is more than 15, there may be a problem in that the pattern of the conductive wires does not operate independently due to excessively high conductivity.

The shape of the refractive index-adjusting material is not particularly limited, but it may be in the form of a sphere, a plate, a flake, a rod or a wire, a hollow-structured sphere, a hollow-structured tube, a hollow-structured wire or a hollow-structured flake, and it may be included inside the polymer composite 10 in this form, and more preferably, the refractive index-adjusting material 20 may be included in a dispersed form inside the polymer substrate constituting the polymer composite 10.

In addition, to the same effect, the refractive index-adjusting material 20 may be selected from a known material, and as non-limiting examples thereof, the refractive index-adjusting material 20 may include at least one selected from the group consisting of a magnetic material, a metal material, a carbon material, a ceramic material and MXene, and it may preferably consist of a plurality of magnetic particles having different resonance frequencies.

In this case, according to an exemplary embodiment of the present invention, when the refractive index-adjusting material is a magnetic material, it may be an iron (Fe)-based metal, a cobalt (Co)-based metal, a nickel (Ni)-based metal, a molybdenum (Mo)-based metal, a manganese (Mn)-based metal or a neodymium (Nd)-based metal, or metal alloy particles thereof. In addition, the magnetic material may be a particle coated with at least one dielectric selected from titanium oxide, barium-titanium oxide and strontium-titanium oxide. In addition, the magnetic material may be a particle in which a magnetic material is coated in one or more carbon-based conductors selected from carbon nanotube, carbon nanofiber, carbon black, carbon fiber and graphene. In addition, the magnetic material may be an iron (Fe)-based metal, a cobalt (Co)-based metal, a nickel (Ni)-based metal, a molybdenum (Mo)-based metal, a manganese (Mn)-based metal, or a neodymium (Nd)-based metal or a metal alloy thereof. In this case, the coating thickness of the magnetic material may be coated to a thickness of 50 nm to 5 µm in consideration of the size of the refractive index-adjusting material.

The refractive index-adjusting material may be included in an amount of 0.01 to 80 wt. % when it is included in a dispersed form in the polymer composite, but when most of the refractive index-adjusting material is formed in the polymer composite, the present invention is not particularly limited, and most of the refractive index-adjusting material may be formed in the polymer composite.

Furthermore, when the refractive index-adjusting material is included in the form of particles, it may have a size of 1 nm to 50 µm, and preferably, 10 nm to 20 µm, but it is not particularly limited because it may be a general size that meets the purpose of the present invention.

Referring to FIG. 1, a plurality of conductive wires 30 are formed on at least one surface of the polymer composite 10.

The conductive wires 30 are formed in the polymer composite 10 and become a major factor for determining matching frequency and absorption capacity. In particular, the conductive wires 30 serve to extremely reduce reflectivity and maximize absorption in this frequency band while passing only a specific frequency according to the shape thereof. In addition, it is possible to obtain the matching frequency of a desired band by controlling the shape, line width and spacing of the conductive wires, and most of the electromagnetic waves are absorbed at this specific frequency such that it is possible to significantly improve the electromagnetic wave-shielding effect.

Meanwhile, the polymer composite 10 and the conductive wires 30 described above satisfy Mathematical Formulas 1 to 3 below. Hereinafter, Mathematical Formulas 1 to 3 will be described below.

$$0.67 \frac{D_{eff}}{n_{eff}c} \leq f(\text{GHz}) \leq 0.83 \frac{D_{eff}}{n_{eff}c} \qquad \text{[Mathematical Formula 1]}$$

wherein the lower limit of f is 15, and the upper limit thereof is a frequency of 80, $D_{eff}$ is the effective spacing of conductive wires represented by Mathematical Formula 2 below, $N_{eff}$ is the effective refractive index of an electromagnetic wave-shielding composite material represented by Mathematical Formula 3 below, and c is the speed of light in free space, Frequency f (GHz)

Since the present invention is directed to providing an electromagnetic wave-absorbing composite material for 5G that shields high frequencies in the millimeter band as the development of wireless electronics, communication, computer, electronic vehicle applications, radar and especially communication technology moves to the $5^{th}$ generation (5G), the frequency f may be 15 GHz to 80 GHZ, and more preferably, 15 to 45 GHZ. Particularly, in the present invention, the lower limit value of the matching frequency f is indicated as f1 and the upper limit value thereof is indicated as f2.

In this case, in order to absorb this specific frequency (f), the fine control of complex physical properties such as the refractive index, thickness, material and dispersed metal material of the electromagnetic wave-absorbing composite material is required, and thus, in order to provide an efficient electromagnetic wave-shielding material that absorbs electromagnetic waves in the GHz frequency band as required by 5G, the structural design for the electromagnetic wave-absorbing composite material that can absorb a specific frequency (5G band) is absolutely necessary, in addition to the structural design that can maximize the absorption capacity of electromagnetic waves.

Accordingly, the present invention has identified the organic relationship between each physical property included in the electromagnetic wave-absorbing composite material as shown in Mathematical Formula 1 above and derived the same as an equation.

Effective Interval ($D_{eff}$)

In Mathematical Formula 1 above, the effective spacing refers to the spacing ($D_{eff}$) of the conductive wires in consideration of the average line width (a) of the conductive wires 30 described above and the influence of the electromagnetic wave wavelength length, and it is in the same relationship with the average spacing (D) of the conductive wires as shown in Mathematical Formula 2 below.

$$D_{eff}=1.53 \exp(0.23(D-a)) \qquad \text{[Mathematical Formula 2]}$$

wherein D is the average spacing of the conductive wires, and a is the average line width of the conductive wires, Effective Refractive Index ($n_{eff}$)

In Mathematical Formula 1 above, the effective refractive index refers to the refractive index of the electromagnetic wave-absorbing composite material in consideration of the thickness occupied by the electromagnetic wave-absorbing composite material in free space, and it is in relationship with the average refractive index (n) of the electromagnetic wave-absorbing composite material as shown in Mathematical Formula 3 below.

$$n_{eff} = \sqrt{1 - \frac{n^2-1}{n^2}\exp\left(\frac{-18d}{D}\right)n} \qquad \text{[Mathematical Formula 3]}$$

wherein n is the average refractive index of the polymer composite,

D is the average spacing of the conductive wires, and d is the thickness of the polymer composite.

In Mathematical Formula 3 above, the average refractive index (n) sets a specific matching frequency or a frequency in the GHz band as the purpose of the present invention, and at the same time, it acts as an important variable in the design of the electromagnetic wave-absorbing composite material that can minimize electromagnetic wave interference between electronic components by maximizing the incident electromagnetic wave absorption capacity. This is because the spacing of the conductive wires as required at the matching frequency varies according to the refractive index, and the electromagnetic wave absorption capacity is highly dependent on the spacing of the conductive wires.

Next, with reference to FIGS. 3 to 12 for Mathematical Formulas 1 to 3 described above, the relationships between the thickness of the polymer composite 10, the average spacing (D) of the conductive wires and the average line width (a) of the conductive wires (a), and the refractive index of the polymer composite 10 will be explained in order.

First of all, in order to identify the relationship between the matching frequency and the absorption capacity according to the thickness (d) of the polymer composite 10, it will be described with reference to FIGS. 4 and 5.

Figure 4:
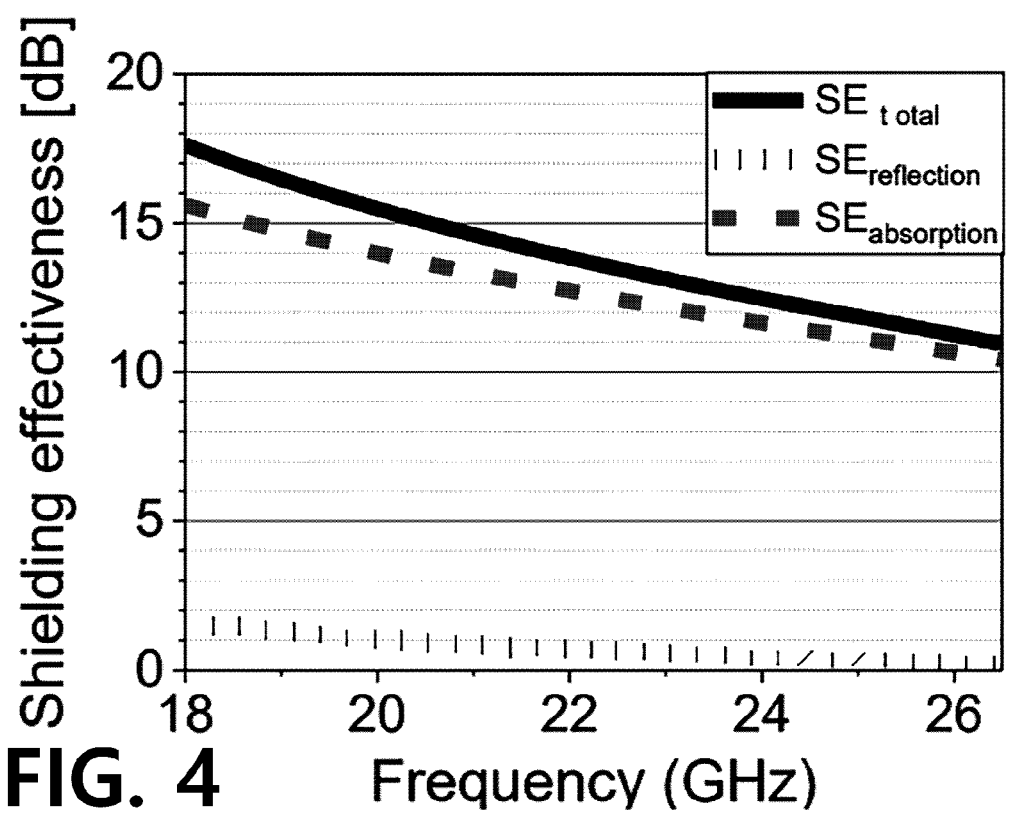
FIGS. 4 and 5 are graphs showing the absorption capacity, reflectivity and shielding capacity of the electromagnetic wave-absorbing composite material manufactured according to Examples 2 to 3, respectively.
Figure 5:
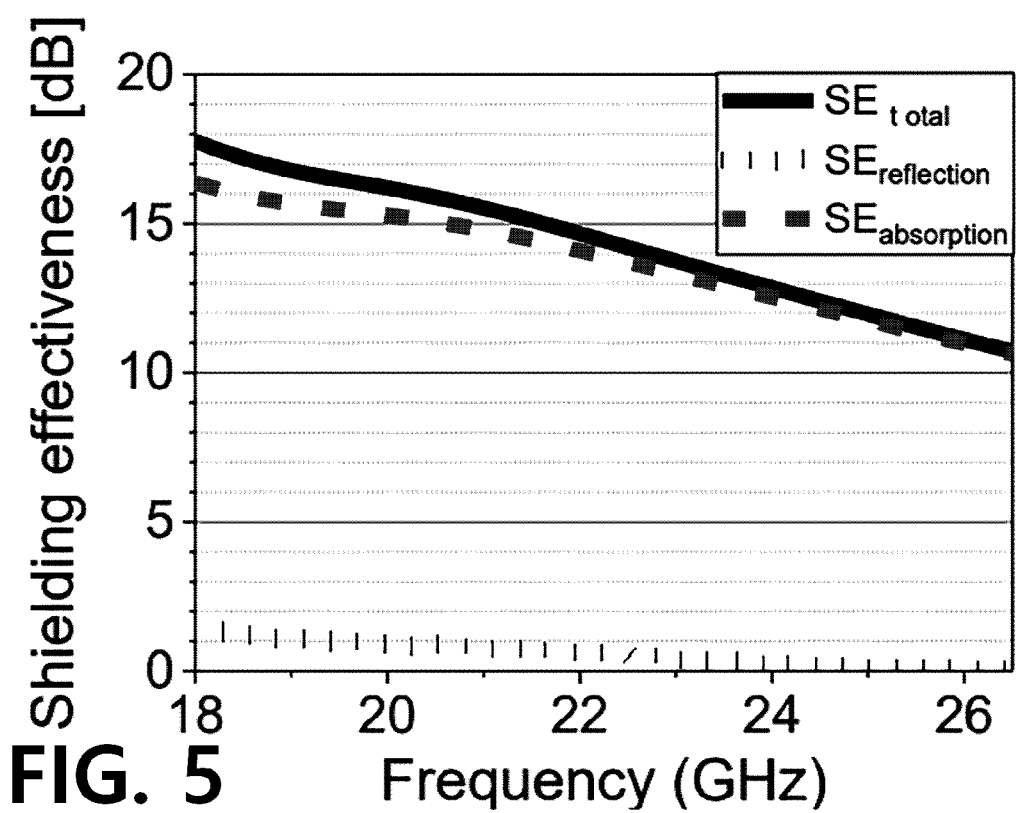

FIGS. 4 and 5 are graph showing the results after the spacing (D) of the conductive wires 30 and the average line width (a) of the conductive wires 30 were set to be constant at 1.5 mm and 250 μm in Examples 2 and 3, respectively, and the electromagnetic absorbing-composite material 100 according to the present invention was manufactured by changing the thickness (d) of the polymer composite 10, and the absorption, reflectivity and shielding ability at specific frequencies described in the graph were evaluated.

In this case, it can be seen that the frequency was 18 to 40 GHz under all of the above thickness, wire width and spacing conditions, and the reflectivity in each example was less than 0.2 dB. In addition, through Examples 2 and 3, it can be seen that the target matching frequency band of the electromagnetic wave-absorbing composite material 100 according to the present invention decreased as the thickness d of the polymer composite 10 increased. As a result, it can be seen that the thickness (d) of the polymer composite 10 is a major factor for determining the matching frequency and absorption capacity of the electromagnetic wave-absorbing composite material 100.

Accordingly, the polymer composite 10 is not particularly limited, because an appropriate polymer material can be selected in consideration of the above-described specific matching frequency and absorption capacity, but as non-limiting examples thereof, it may be a thermosetting or thermoplastic material, and polymer materials such as epoxy, silicone rubber, polyurethane, polyethylene, polyethylene terephthalate (PET), polyestersulfone (PES), polyarylate (PAR), polyimide (PI) and polycarbonate (PC) may be used, or two or more selected therefrom may be mixed and manufactured. Preferably, it may be thermoplastic polyurethane.

In addition, the thickness (d) of the polymer composite 10 can be appropriately controlled in consideration of the desired matching frequency and absorption capacity, and for example, it may have a thickness d of 100 to 2,000 μm, and preferably have a thickness of 200 to 500 μm in order to have a matching frequency in the 5 g band. In this case, if the thickness of the polymer composite 10 is less than 100 μm, there may be a problem of not expressing sufficient absorption capacity, and if the thickness of the polymer composite 10 is more than 2,000 μm, there may be a problem in that it is too thick and difficult to apply to 5G terminal devices.

Next, in order to identify the relationship between the matching frequency and the absorption capacity for the spacing D of the conductive wires 30, it will be described with reference to FIGS. 6 and 7.

Figure 6:
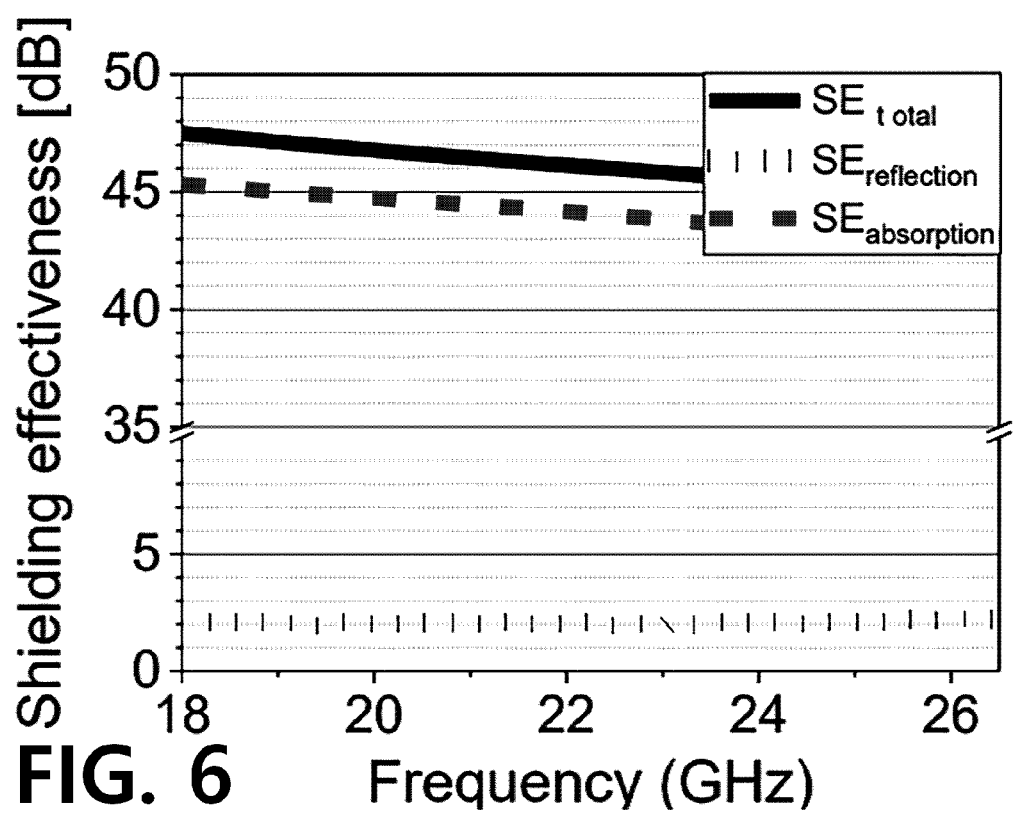
FIGS. 6 and 7 are graphs showing the absorption capacity, reflectivity and shielding capacity of the electromagnetic wave-absorbing composite materials manufactured according to Comparative Examples 1 and 2, respectively.
Figure 7:
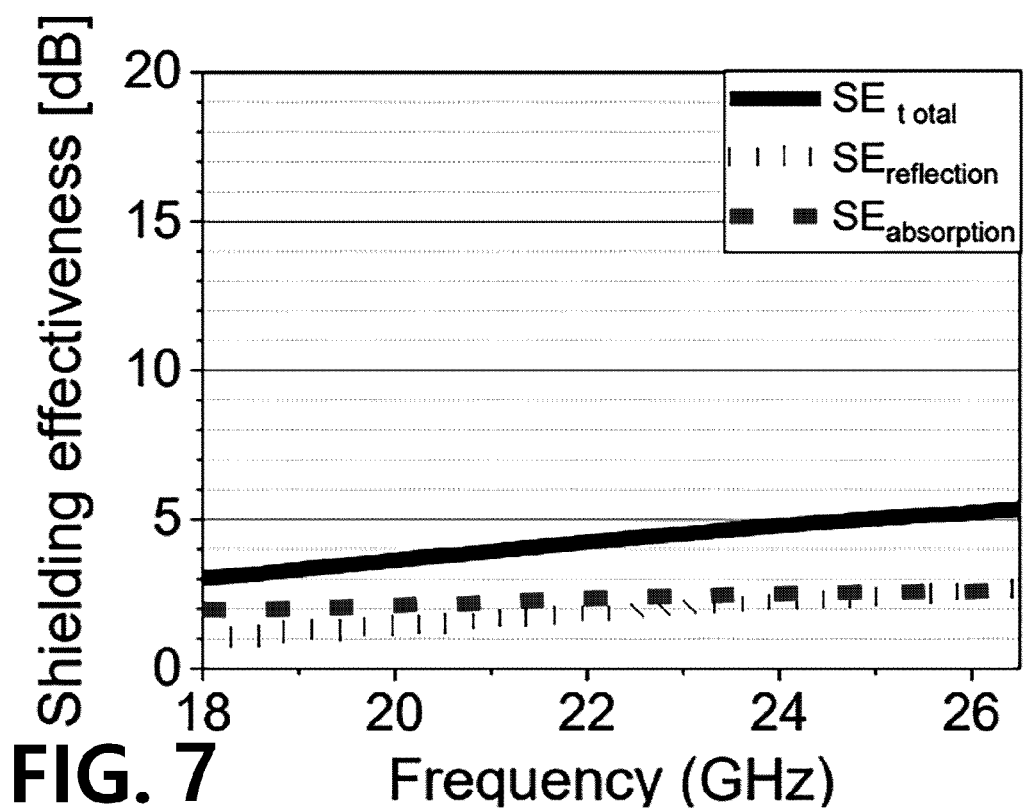

FIGS. 6 and 7 are graphs showing the results of evaluating the absorption, reflectivity and shielding ability at specific frequencies described in the graph, after the thickness d of the polymer composite 10 and the line width a of the conductive wires 30 were set to be constant at 200 μm and 150 μm, respectively, and after the electromagnetic wave-absorbing composite material 100 according to the present invention was manufactured by changing the spacing D of the conductive wires 30.

Referring to FIGS. 6 and 7, it can be seen that Comparative Examples 1 and 2 exhibited very high reflectivity exceeding 0.2 dB compared to Example 1, and the absorption capacity was rather significantly reduced. Accordingly, it can be seen that the spacing D of the conductive wires 30 is a major factor for determining the absorption, reflectivity and shielding ability.

Figure 2A:
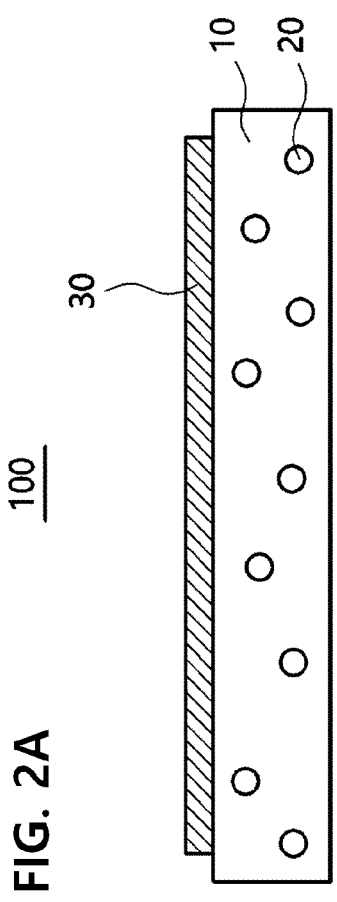
FIG. 2A is a diagram showing that the refractive index-adjusting material of the electromagnetic wave-absorbing composite material according to the present invention is included.
Figure 2B:
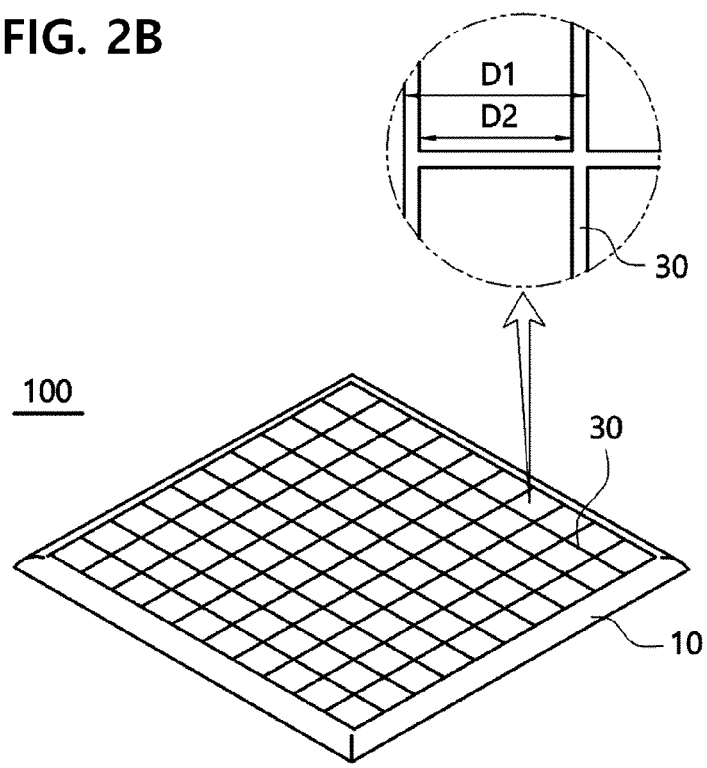
FIGS. 2B and 2C are diagrams for explaining the average spacing and average line width of the conductive wires according to the present invention.

Accordingly, the average spacing D of the conductive wires 30 may be 0.5 to 10 mm, and more preferably, 0.5 to 2 mm. However, the preferred range refers to a spacing when the conductive wires 30 have a single interval, and when the conductive wire 30 has multiple intervals as will be described below, it may have an average spacing D in the range of 0.5 to 10 mm. In this case, as shown in FIG. 2a, the average spacing D of the conductive wires refers to the average of the distances between one conductive wire and the other one adjacent thereto, when the conductive wires are formed in the form of a mesh according to an exemplary embodiment of the present invention. In addition, while the average spacing of the conductive wires may mean including both D1 or D2, preferably, D2, that is, the portion where the conductive wires are formed means the spacing between the outermost periphery of the conductive wire that is omitted and the outermost periphery of the adjacent conductive wire.

In this case, according to an exemplary embodiment of the present invention, if the average spacing of the conductive wires is less than 0.5 mm, there may be a problem in that the reflectivity is not reduced in the matching frequency band due to interference between the conductive wires, and if the average spacing of the conductive wires is more than 10 mm, there may be a problem of not expressing sufficient absorption capacity.

Next, in order to identify the relationship between the matching frequency and the absorption capacity for the line width (a) of the conductive wire 30, it will be described with reference to FIGS. 8 and 9.

Figure 8:
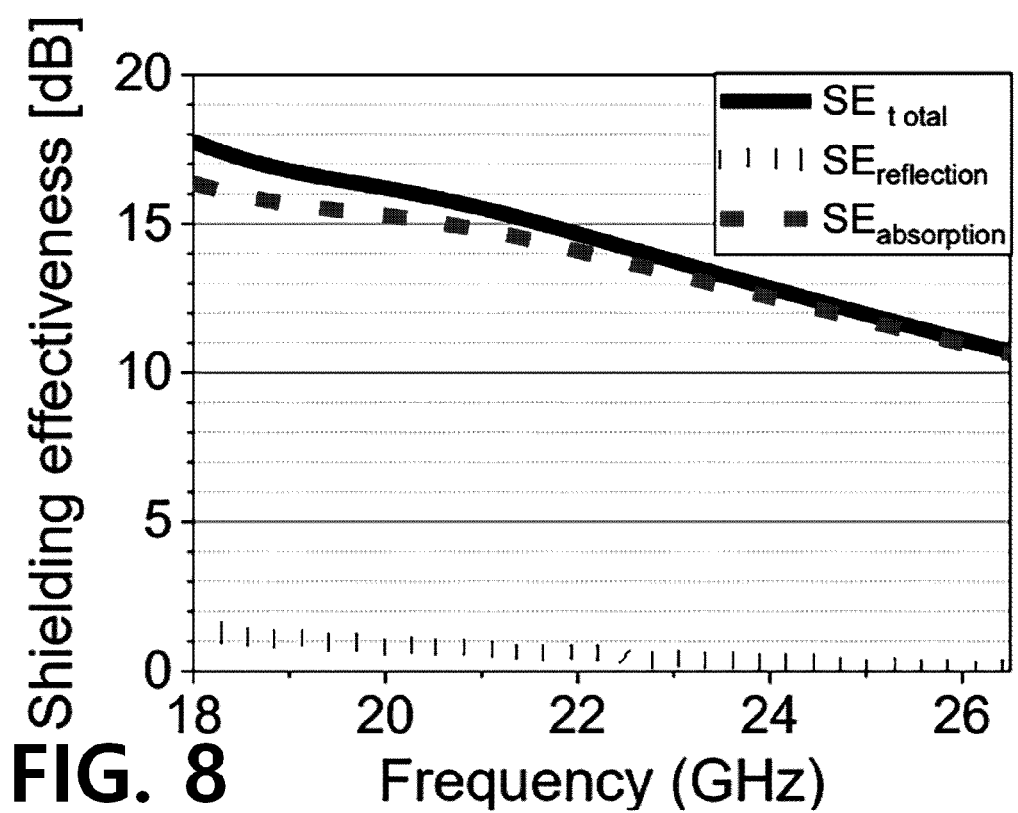
FIGS. 8 and 9 are graphs showing the absorption, reflectivity and shielding abilities of the electromagnetic wave-absorbing composite materials manufactured according to Examples 4 and 5, respectively.
Figure 9:
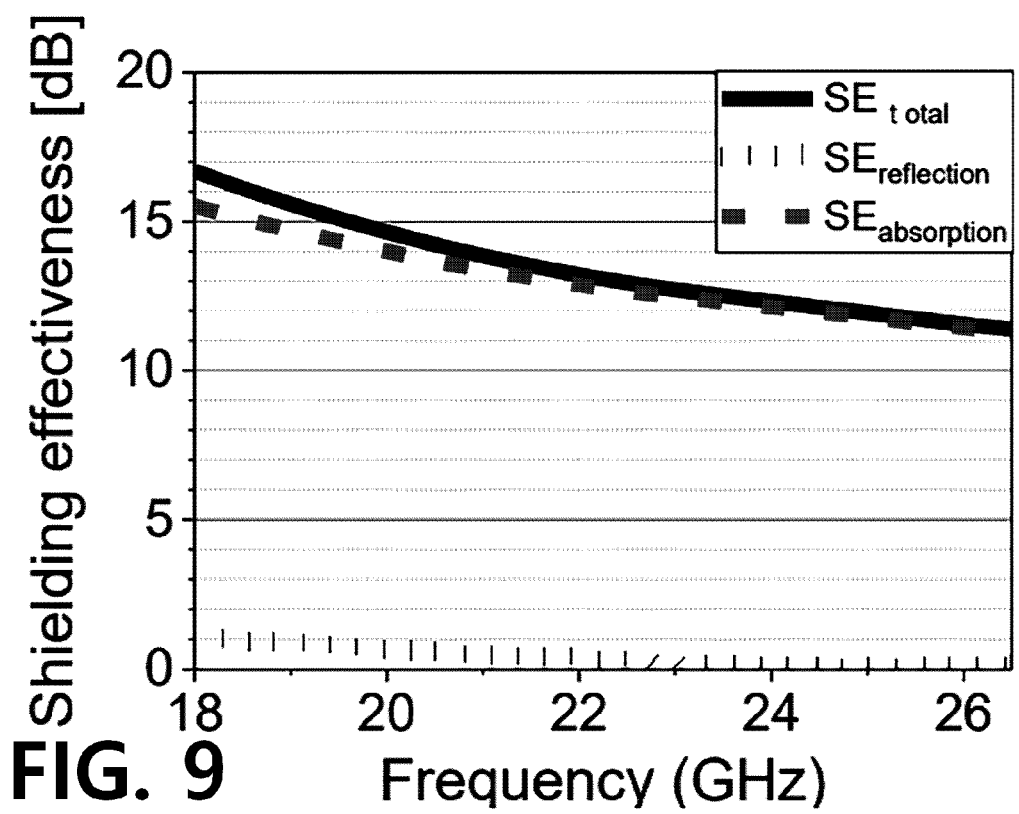

FIGS. 8 and 9 are graphs showing the results of evaluating the absorption, reflectivity and shielding ability at specific frequencies, after the spacing (D) of the conductive wires 30 and the thickness (d) of the polymer composite 10 were set to 1.5 mm and 400 μm in Examples 4 and 5, respectively, and the electromagnetic wave-absorbing composite material 100 according to the present invention was manufactured by changing the line width a of the conductive wires.

In this case, it can be seen that the reflectivity in each example was less than 0.2 dB while exhibiting 18 to 40 GHz under all of the above thickness, wire width and spacing conditions. In addition, through Examples 4 and 5, it can be seen that the electromagnetic wave-absorbing composite material 100 according to the present invention can adjust the target matching frequency band by properly designing the line width a of the conductive wire 30.

Through this, it can be seen that the line width a of the conductive wires 30 is an important factor for determining the matching frequency and reflectivity.

Figure 2C:
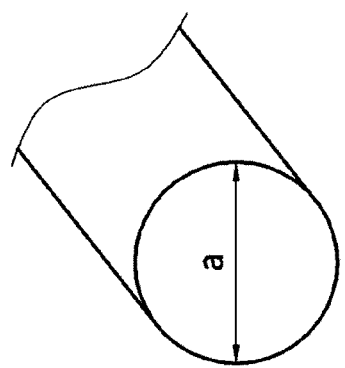
Figure 2C:
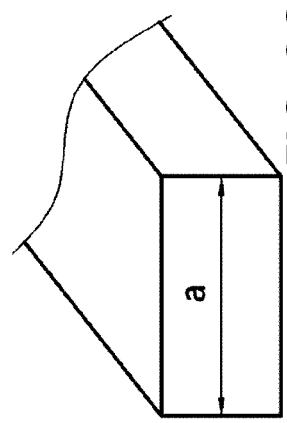

Accordingly, the line width a of the conductive wires may be 50 to 500 μm, and more preferably, 100 to 300 μm. In this case, as illustrated in FIG. 2c, the average line width a means the longest width of the conductive wires, when the conductive wires are formed in a circular shape according to an exemplary embodiment of the present invention. In addition, when the conductive wire is formed on a polygonal shape, which is another exemplary embodiment of the present invention, it also means the longest direction among the horizontal and vertical directions.

In this case, according to an exemplary embodiment of the present invention, if the line width of the conductive wires is less than 50 μm, sufficient absorption capacity may not be expressed, and if the line width of the conductive wire is more than 500 μm, there may be a problem in that reflectivity is not reduced in the matching frequency band due to interference between conductive wires.

In addition, the conductive wire may include at least one of a conductor which is an iron (Fe)-based metal, a cobalt (Co)-based metal, a nickel (Ni)-based metal, a molybdenum (Mo)-based metal, a manganese (Mn)-based metal, a neodymium (Nd)-based metal, a gold (Au)-based metal, a silver (Ag)-based metal, a copper (Cu)-based metal, an aluminum (Al)-based metal, a platinum (Pt)-based metal, a carbon nanotube, a carbon nanofiber, carbon black, a carbon fiber and graphene or a palladium (Pd)-based metal or an alloy thereof, and a conductive polymer which is MXene or polypyrrole, polyaniline, polyacetylene, polyparaphenylenevinylene, polythiophene, polyethylenedioxythiophene, polyphenylene sulfide or a combination thereof.

In this case, the conductive wires may be in the form of a mesh, a circle, a polygon, a split ring or a complex shape including any one or more thereof. More specifically, the conductive wires may be formed of periodically arranged conductive wires, may be formed of non-periodically arranged conductive wires, and may be curved rather than straight. Preferably, the conductive wires may be periodically arranged in a mesh form, and in this case, the electromagnetic wave absorption efficiency may be further improved.

In addition, the conductive wires 30 may be formed in multiple intervals or a single interval. That is, in the electromagnetic wave-absorbing composite material 100 according to the present invention, the conductive wires 30 may be formed in a single interval as shown in FIG. 1 according to an exemplary embodiment of the present invention, but according to another exemplary embodiment of the present invention, the conductive wires 30 may be formed in multiple intervals as shown in FIG. 2d.

Figure 10:
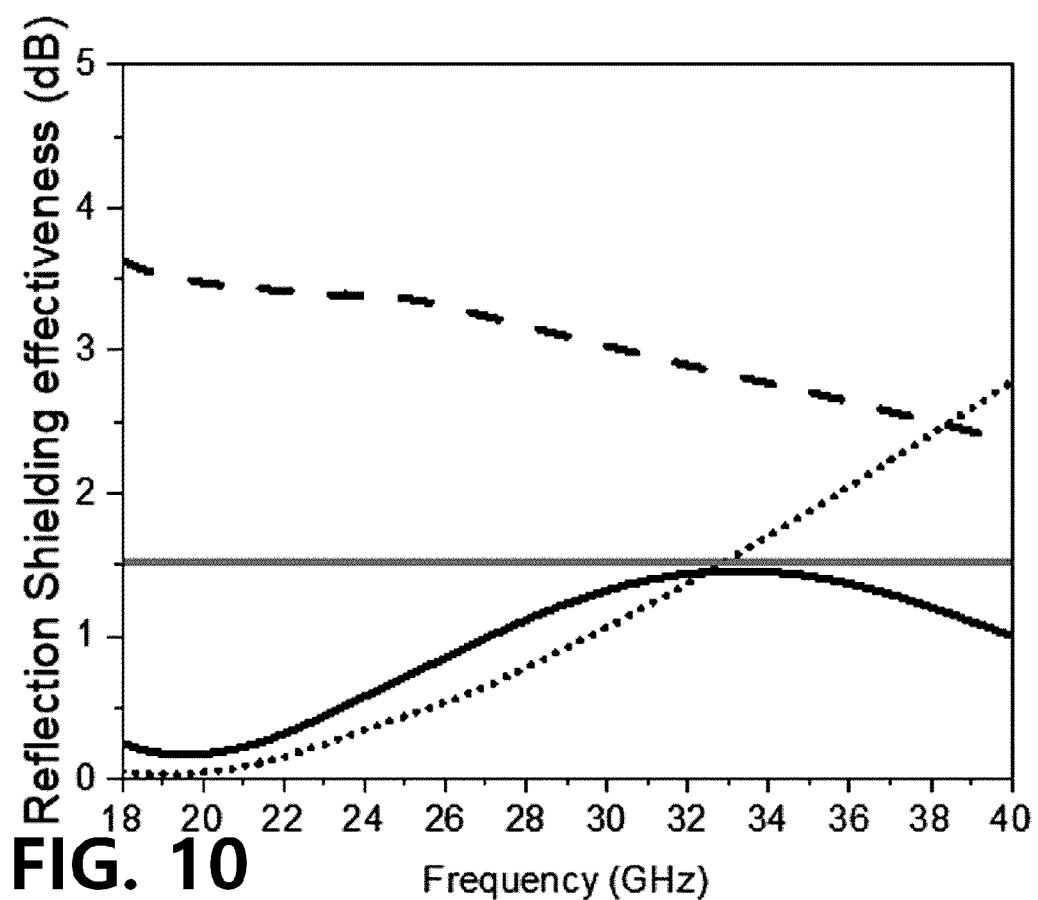
FIGS. 10 and 11 are graphs showing the reflectivity of conductive wires having multiple spacing.
Figure 11:
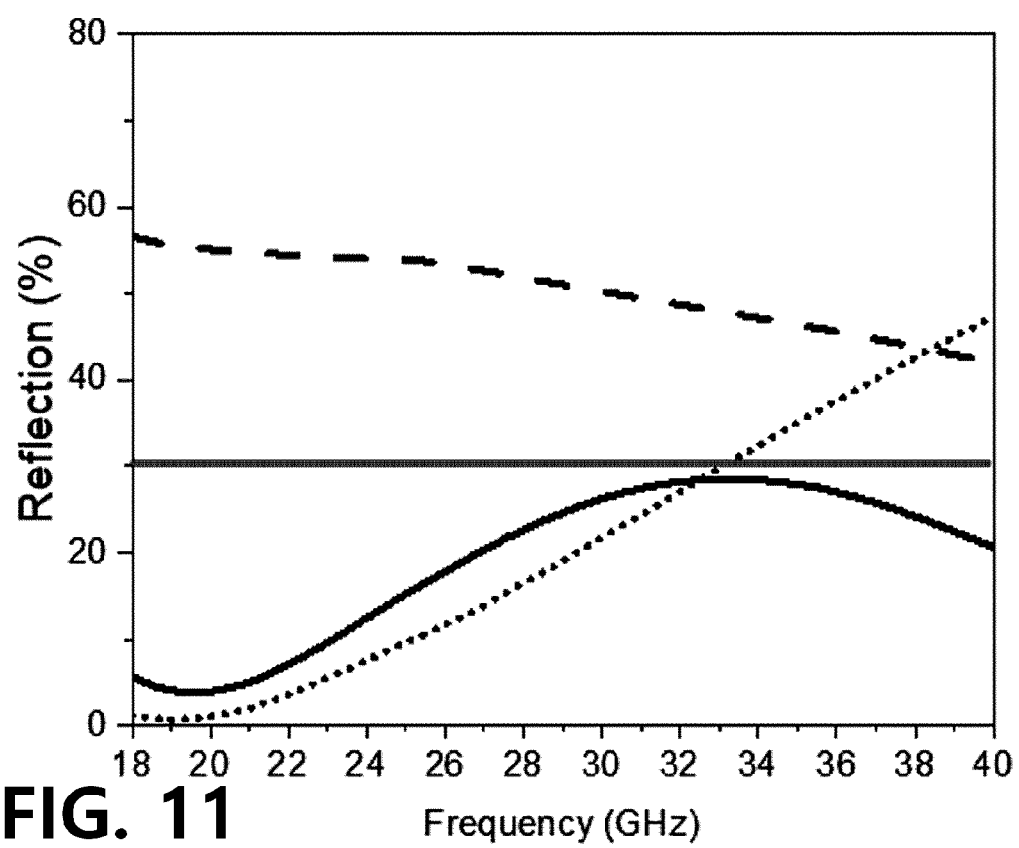

Generally, as shown in FIG. 1, the conductive wire 30 having a single interval can reduce reflectance at a specific frequency matched by properly controlling the spacing or line width as described above, but as shown in dotted or broken lines in FIGS. 10 and 11, the reflectivity may increase rapidly at unmatched frequencies. That is, when matching at high frequencies by controlling the spacing or line width of the conductive wires 30, reflectivity may decrease from low to high frequencies, and when matching at low frequencies, reflectivity may increase from high to low frequencies.

Figure 2D:
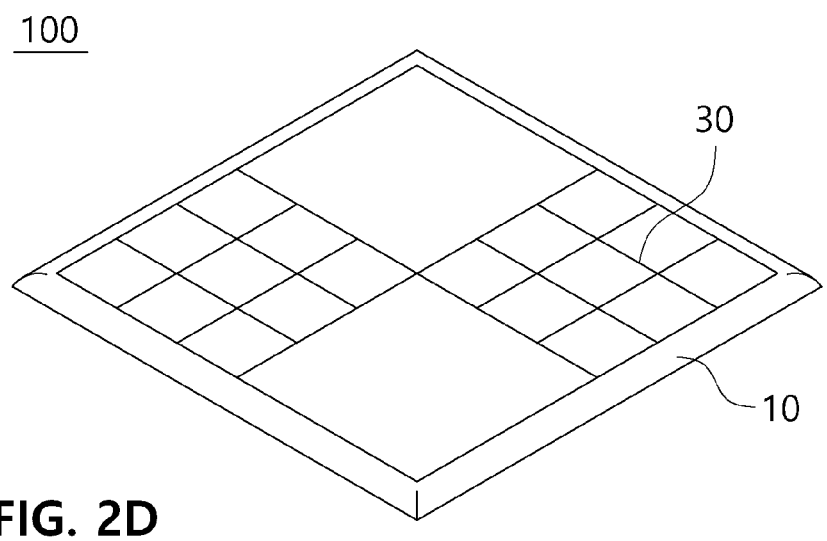
FIG. 2D is a mimetic diagram showing conductive wires having multiple intervals according to an exemplary embodiment of the present invention.
Figure 3:
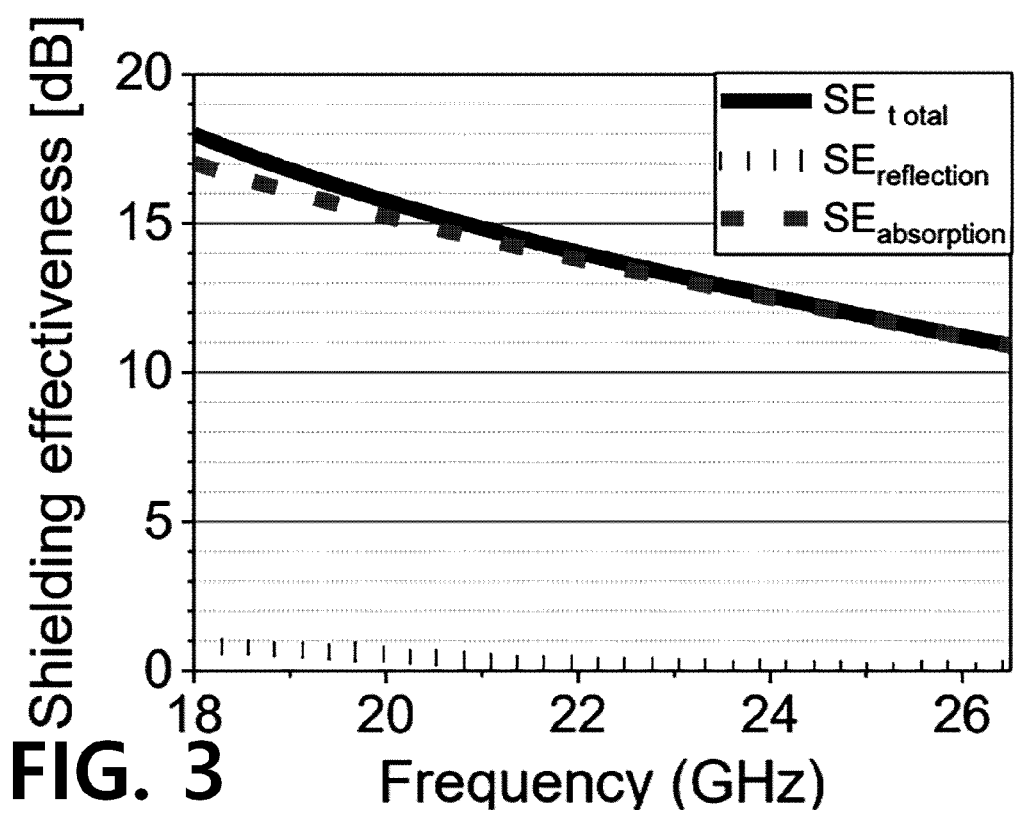
FIG. 3 is a graph showing the absorption capacity, reflectivity and shielding capacity of the electromagnetic wave-absorbing composite material manufactured according to Example 1.

Conversely, in the case of the conductive wires 30 having multiple intervals as shown in FIG. 2d, as shown by solid lines in FIGS. 10 and 11, overall low reflectivity can be exhibited in a wide frequency band. More preferably, when the conductive wires are formed in multiple intervals, reflectance of 30% or less or reflectivity of 1.5 dB or less may be exhibited.

In this way, the present invention can maintain constant reflectivity in a wide frequency band as well as a specific matching frequency through the diversification of the spacing of the conductive wires 30. In this case, in the present invention, only two different types of spacing have been described for the multiple intervals, but since this is only a preferred exemplary embodiment, the present invention is not limited thereto, and multiple intervals of the conductive wires 30 may mean having at least two different types of intervals.

Meanwhile, the conductive wires may be formed in an area of 25% to 65% on any one surface of the polymer composite, and more preferably, it may be formed in an area of 30% to 50% on any one surface of the uppermost surface of the laminated polymer composite. In this case, if the area of the conductive wires is less than 25%, there may be a problem of not expressing sufficient absorption capacity, and if the area of the conductive wire is more than 65%, there may be a problem in that the reflectivity is not reduced in the matching frequency band due to interference between the conductive wires.

Meanwhile, Comparative Examples 3 and 4 below were manufactured in order to identify Mathematical Formula 3 above for the refractive index. Comparative Examples 3 and 4 are electromagnetic wave-absorbing composite materials that were manufactured by setting the remaining conditions in the same way, but changing the refractive index-adjusting material included in the conductive polymer composite 10 such that the average refractive index n of the polymer composite was 2 and 18, respectively.

Figure 12:
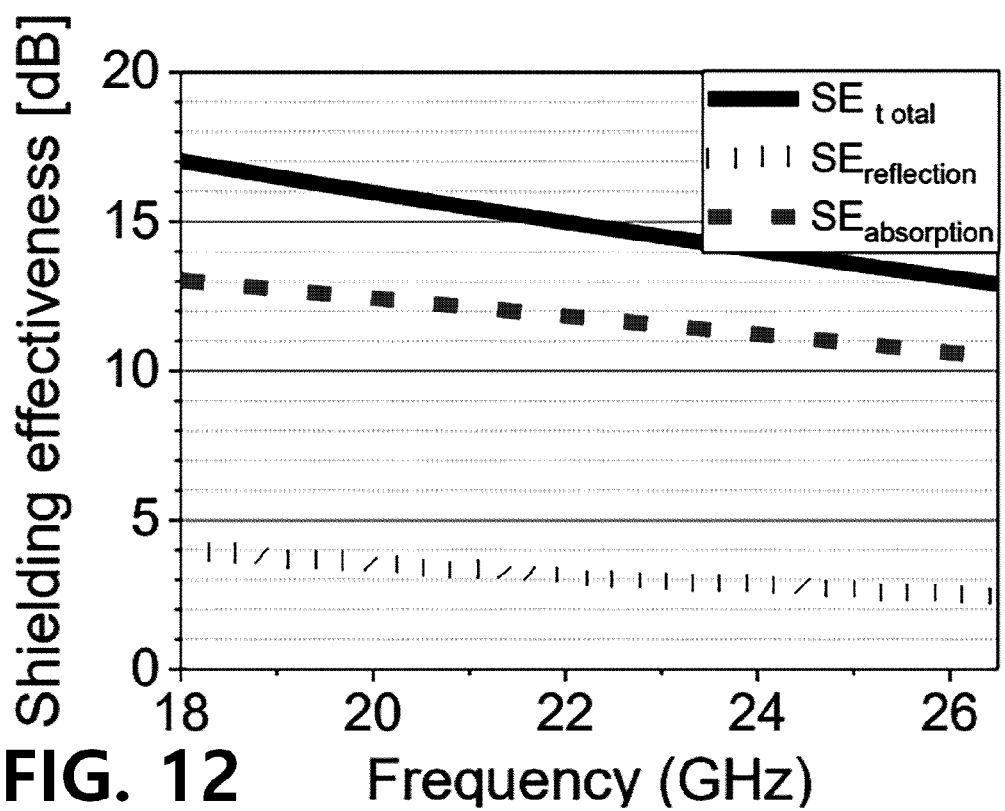
FIGS. 12 and 13 are graphs showing the absorption capacity, reflectivity and shielding capacity of the electromagnetic wave-absorbing composite materials manufactured according to Comparative Examples 3 and 4, respectively.
Figure 13:
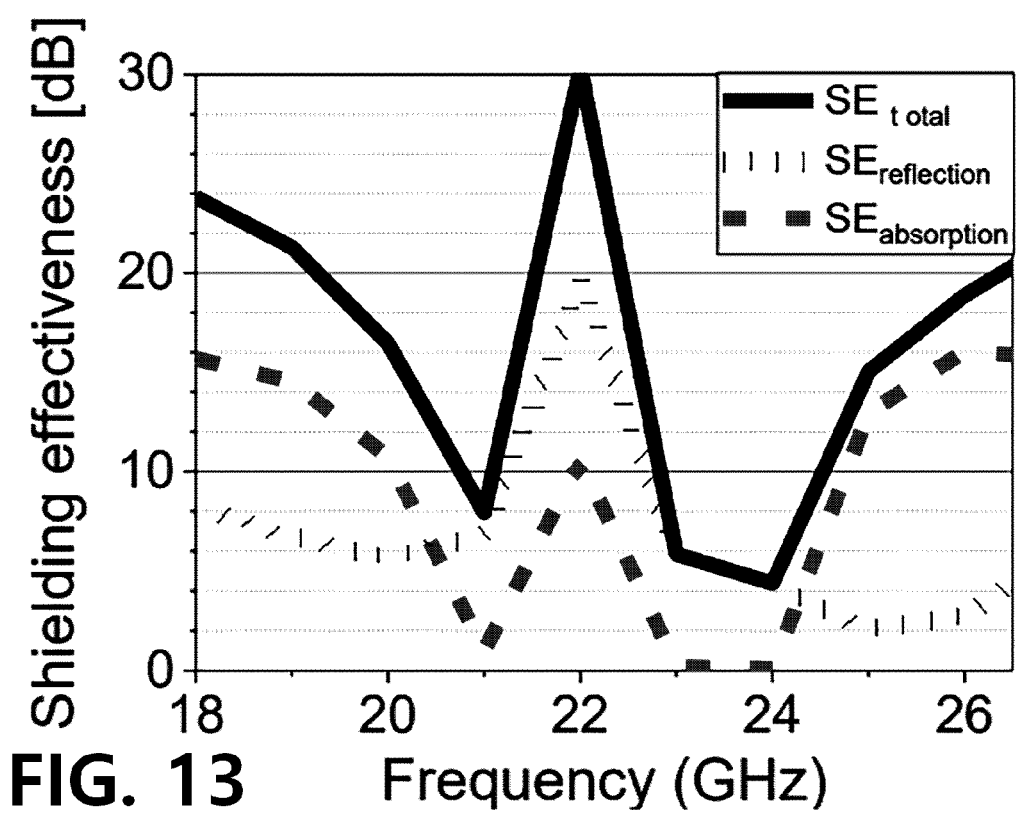

Referring to FIGS. 12 and 13 and Tables 1 and 2, Comparative Examples 3 and 4 above exhibited reflectivity that was much higher than the reflectivity of 0.2 dB or less, which is aimed in the present invention, at the same 22.5 GHz measurement frequency as in Example 1 described above. Through this, the average refractive index n of the polymer composite as described above is a major factor for determining the matching frequency, reflectivity and absorption capacity, and through an appropriate design of the thickness d of the polymer composite 10, it was found that it is possible to set the target matching frequency and design an efficient electromagnetic wave-absorbing composite material by controlling the average refractive index n.

As such, since the average refractive index n is a factor that must be considered in setting the matching frequency and designing an efficient electromagnetic wave-absorbing composite material for the purpose of the present invention, the average refractive index n may be 3 to 15, and more preferably, 4 to 10. In this case, if the average refractive index is less than 3, there may be a problem of not achieving the desired absorption capacity, and if the average refractive index is more than 15, there may be a problem in that the pattern of the conductive wires does not operate independently due to excessively high conductivity.

Figure 14:
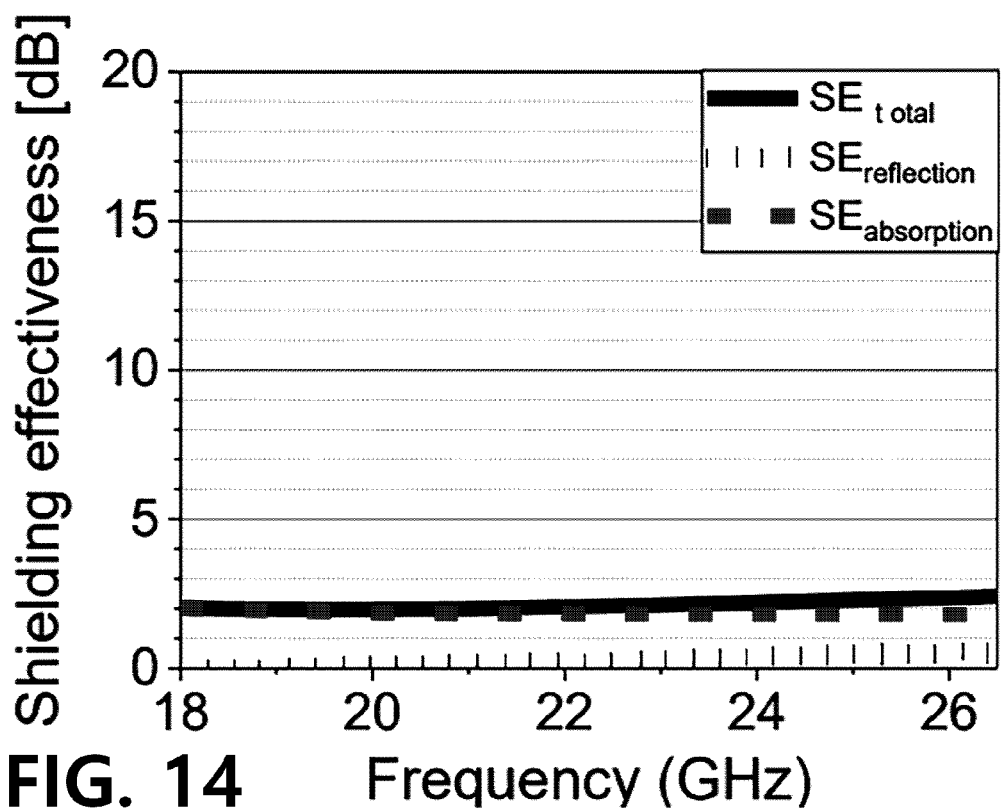
FIGS. 14 and 15 are graphs showing the absorption capacity, reflectivity and shielding capacity of the electromagnetic wave-absorbing composite materials manufactured according to Example 6 and Comparative Example 5, respectively.
Figure 15:
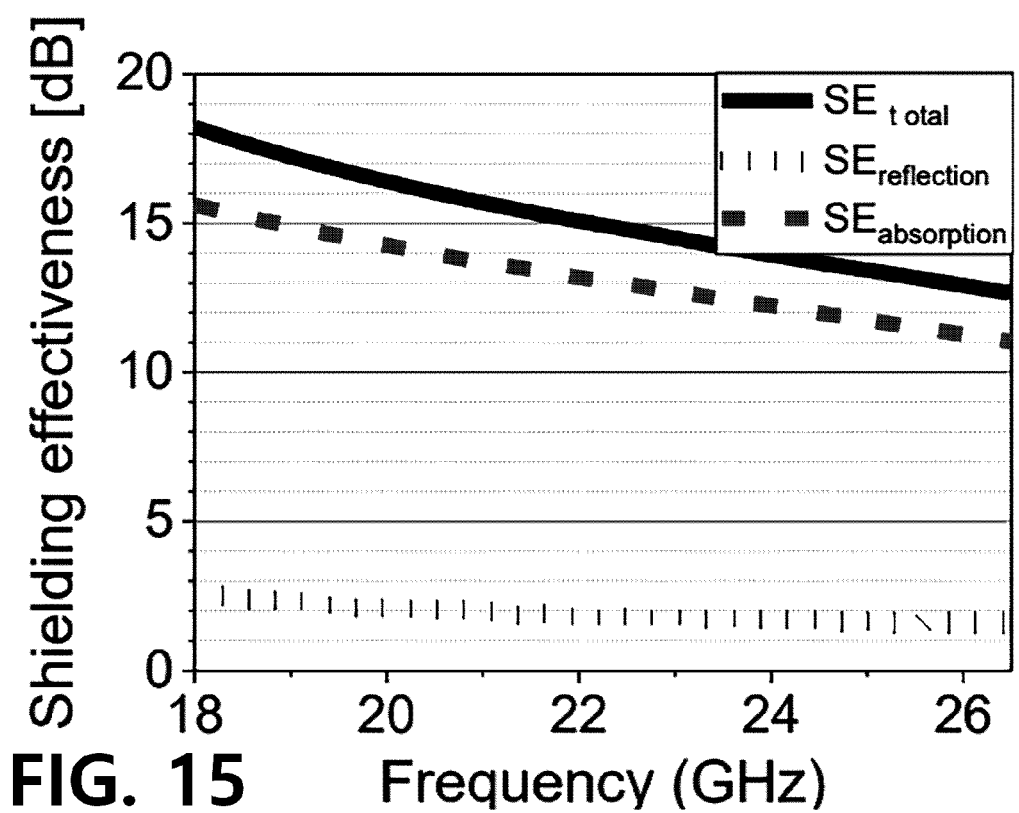

Next, if only one of the thickness of the above-described polymer composite and the average line width of the conductive wire of the present invention does not meet the conditions of the present invention, Example 6 and Comparative Example 5 were manufactured in order to confirm that it is not possible to simultaneously exhibit the desired minimized reflectivity of 0.2 dB or less or the frequency band that is suitable for the 5G band, and the results are illustrated in FIGS. 14 and 15, respectively.

Example 6 and Comparative Example 5 were manufactured by changing the thickness of the polymer composite and the average spacing of the conductive wires in Example 1 above as shown in Table 1 below, and the absorption, reflectivity and shielding ability at specific frequencies were evaluated and shown in Table 2.

Referring to Tables 1 and 2, it can be seen that unlike Example 1, Example 6 exhibited only matching frequencies of 14 to 18 GHz, and unlike Example 1, Comparative Example 5 exhibited a reflectivity that is much higher than the reflectivity of 0.2 dB or less, which is aimed by the present invention.

Through these results, when only one of the above-described thickness of the polymer composite, the average line width of the conductive wire and the average spacing thereof does not meet the conditions of the present invention, it can be seen that it is not possible to achieve the matching frequency, reflectivity and absorption capacity which are aimed by the present invention, and it has been identified that it is possible to set a target matching frequency and design an efficient electromagnetic wave-absorbing composite material through the specific design thereof.

Furthermore, the present invention has identified that only when the thickness of the above-described polymer composite, the average line width of the conductive wires and the average spacing thereof all meet the conditions of the present invention, it is possible to maximize the electronic wave absorption capacity in the target matching frequency band of the electromagnetic wave-absorbing composite material as identified through Mathematical Formulas 1 to 3, and relationship formulas that can design the organic relationship thereof were derived, and at the same time, it can be seen that the optimal conditions for maximizing the incident electromagnetic wave absorption capacity at the set matching frequency were confirmed.

Meanwhile, the electromagnetic wave-absorbing composite material according to the present invention may have an electromagnetic wave absorption rate of 90% or more. Referring to Examples 1 to 6 and Comparative Examples 1 to 5, which have already been described above, all of the examples showed electromagnetic wave absorption rates close to 90%, but it can be seen that the comparative examples that did not satisfy Mathematical Formulas 1 to 3 of the present invention exhibited significantly low absorption rates.

In particular, the electromagnetic wave-absorbing composite material according to the present invention may have an electromagnetic wave reflectance of 0.5 dB or less at a frequency of 26 GHz. In addition, electromagnetic waves reflected in the range of the matching frequency (f) derived through Mathematical Formulas 1 to 3 may be 0.1 dB or less.

This is a general frequency band required by 5G, and even in this case, it has electromagnetic wave reflectivity of 0.5 dB or less such that it can be used for various electronic component materials according to the recent development trend in the information and communication industry.

Accordingly, the present invention provides an electromagnetic wave-absorbing circuit module including a circuit board on which elements are mounted; and the electromagnetic wave-absorbing composite material according to the present invention provided on the circuit board to cover at least one surface of the elements, and an electronic device including such a circuit module electromagnetic wave-absorbing circuit module.

The circuit module is not particularly limited, but as a non-limiting example thereof, it may be a circuit module that is usable in a band that requires 5G, and the electronic device includes one or more electronic components and is used in all industrial fields that require electromagnetic wave shielding.

Next, the method for manufacturing an electromagnetic wave-absorbing composite material according to the present invention will be described. However, in order to avoid duplicate descriptions, the descriptions of portions overlapping with the above-described electromagnetic wave-absorbing composite material and technical ideas are omitted.

The present invention provides a method for manufacturing an electromagnetic wave-absorbing composite material, including the steps of (1) preparing a polymer composite; and (2) forming a conductive wire on the polymer composite, wherein the average refractive index and thickness of the polymer composite and the line width and spacing of the conductive wires are controlled such that electromagnetic waves reflected in a matching frequency (f) range derived through Mathematical Formulas 1 to 3 below are 0.2 dB or less:

$$0.67 \frac{D_{eff}}{n_{eff} c} \leq f(\text{GHz}) \leq 0.83 \frac{D_{eff}}{n_{eff} c} \quad \text{[Mathematical Formula 1]}$$

wherein the lower limit of f is 15, and the upper limit thereof is a frequency of 80, $D_{eff}$ is the effective spacing of conductive wires represented by Mathematical Formula 2 below, $N_{eff}$ is the effective refractive index of an electromagnetic wave-shielding composite material represented by Mathematical Formula 3 below, and c is the speed of light in free space, $$D_{eff} = 1.53 \exp(0.23(D-a)) \quad \text{[Mathematical Formula 2]}$$

wherein D is the average spacing of the conductive wires, and a is the average line width of the conductive wires, $$n_{eff} = \sqrt{1 - \frac{n^2-1}{n^2}\exp\left(\frac{-18d}{D}\right)} n \quad \text{[Mathematical Formula 3]}$$

wherein n is the average refractive index of the polymer composite,

D is the average spacing of the conductive wires, and d is the thickness of the polymer composite.

First of all, in order to prepare the polymer composite of step (1), a polymer composite solution including a polymer material and a solvent is prepared.

The polymer material is not particularly limited, but as non-limiting examples thereof, it may be a thermosetting or thermoplastic material, and polymer materials such as epoxy, silicone rubber, polyurethane, polyethylene, polyethylene terephthalate (PET), polyestersulfone (PES), polyarylate (PAR), polyimide (PI) and polycarbonate (PC) may be used, or two or more selected therefrom may be mixed and manufactured. More preferably, it may be thermoplastic polyurethane.

In addition, the solvent may be a material that is commonly used in the technical field to which the present invention pertains, although it is not particularly limited, diethyl propanediol, dipropylene glycol methyl ether, n,n-dimethylformaldehyde (DMF) and the like may be used as the solvent as non-limiting examples thereof, and preferably, n,n-dimethylformaldehyde (DMF) may be used as the solvent.

In addition, the polymer material and the solvent in the polymer solution may be mixed in a composition that is suitable for the purpose of the present invention, and as a non-limiting example thereof, the polymer material and the solvent may be included in an amount of 60 to 80:20 to 40 wt. %, respectively.

According to an exemplary embodiment of the present invention, when the polymer solution is prepared by using polyurethane and dimethylformaldehyde, it can be prepared by stirring in a stirrer at 1,000 to 3,000 rpm for 2 to 10 minutes, and then, after the mixed material is cast to a thickness of 30 to 200 μm, it may be dried at 50 to 150° C. to prepare a polymer composite by removing the dimethylformaldehyde solvent.

In this case, a plurality of polymer composites that are prepared above may be laminated, and a single polymer composite may be obtained by pressing the laminated plurality of polymer composites with heat of 80 to 150° C. and pressure of 5 to 15 Mpa for 2 to 10 minutes. In this case, when pressing, the thickness of the polymer composite to be prepared can be controlled by using a thickness gauge.

Next, the polymer composite in step (1) that is prepared as described above may further include a refractive index-adjusting material, and although the shape of the refractive index-adjusting material is not particularly limited, it may be in the form of a sphere, a plate, a flake, a rod or a wire, a hollow-structured sphere, a hollow-structure tube, a hollow-structured wire or a hollow-structured flake. In addition, it may be included inside the polymer composite in this shape, and more preferably, the refractive index-adjusting material 20 may be included in a dispersed form inside the polymer substrate constituting the polymer composite 10.

In addition, to the same effect, the refractive index-adjusting material 20 may be selected from a known material, and as non-limiting examples thereof, the refractive index-adjusting material 20 may include at least one selected from the group consisting of a magnetic material, a metal material, a carbon material, a ceramic material and MXene, and it may preferably consist of a plurality of magnetic particles having different resonance frequencies.

In this case, according to an exemplary embodiment of the present invention, when the refractive index-adjusting material is a magnetic material, it may be an iron (Fe)-based metal, a cobalt (Co)-based metal, a nickel (Ni)-based metal, a molybdenum (Mo)-based metal, a manganese (Mn)-based metal or a neodymium (Nd)-based metal, or metal alloy particles thereof. In addition, the magnetic material may be a particle coated with at least one dielectric selected from titanium oxide, barium-titanium oxide and strontium-titanium oxide. In addition, the magnetic material may be a particle in which a magnetic material is coated in one or more carbon-based conductors selected from carbon nanotube, carbon nanofiber, carbon black, carbon fiber and graphene. In addition, the magnetic material may be an iron (Fe)-based metal, a cobalt (Co)-based metal, a nickel (Ni)-based metal, a molybdenum (Mo)-based metal, a manganese (Mn)-based metal, or a neodymium (Nd)-based metal or a metal alloy thereof. In this case, the coating thickness of the magnetic material may be coated to a thickness of 50 nm to 5 μm in consideration of the size of the refractive index-adjusting material.

Furthermore, when the refractive index-adjusting material is included in the form of particles, it may have a size of 1 nm to 50 μm, and preferably, 10 nm to 20 μm, but it is not particularly limited because it may be a general size that meets the purpose of the present invention.

In addition, for the method of including the refractive index-adjusting material in the polymer composite, it is not particularly limited, but for example, it can be formed by adding a desired amount of the refractive index-adjusting material to the polymer composite and uniformly dispersing the same with a homo mixer, an ultrasonic disperser and a 3 roll mill.

Next, step (1) may be a polymer composite in which at least one polymer composite is laminated, and afterwards, for step (2), it may include the step of forming a conductive wire with an area of 25% to 35% on any one surface of the laminated polymer composite.

The conductive wire of step (2) may be manufactured by using various methods, and is not particularly limited. For example, after manufacturing a mask by using photo lithography or laser processing, a conductive wire made of chromium (Cr), chromium oxide (Cr) or the like may be formed on a non-conductive resin, and then, a conductive wire made of chromium (Cr), chromium oxide (Cr) or the like may be plated with nickel (Ni), copper (Cu) or the like by using the plating method to form a conductive wire.

In this case, the conductive wire of step (2) above may be sewn on any one surface of the polymer composite by using the conductive wire which is at least one of a conductor which is an iron (Fe)-based metal, a cobalt (Co)-based metal, a nickel (Ni)-based metal, a molybdenum (Mo)-based metal, a manganese (Mn)-based metal, a neodymium (Nd)-based metal, a gold (Au)-based metal, a silver (Ag)-based metal, a copper (Cu)-based metal, an aluminum (Al)-based metal, a platinum (Pt)-based metal, a carbon nanotube, a carbon nanofiber, carbon black, a carbon fiber and graphene or a palladium (Pd)-based metal or an alloy thereof, and a conductive polymer which is MXene or polypyrrole, polyaniline, polyacetylene, polyparaphenylenevinylene, polythiophene, polyethylenedioxythiophene, polyphenylene sulfide or a combination thereof, and a mixture of fibers including at least one of a polyurethane-based fiber, a polyamide-based fiber, a polyester-based fiber, an acrylic-based fiber, a polyolefin-based fiber, a cellulose-based fiber, a carbon-based fiber and a glass fiber.

In addition, according to an exemplary embodiment of the present invention, when polyurethane is used as a mixture material of the conductive wire and sewn to the polymer composite, there is an advantage in that the electromagnetic properties of the material are not affected, because there is no conductivity and the refractive index is low.

In this case, after obtaining a polymer composite having a desired thickness, the conductive grid is sewn by using the Ag@Nylon thread as the conductive wire and the polyurethane thread as the upper thread. In this case, the spacing of the conductive grid can be adjusted by changing the sewing machine settings.

Hereinafter, the present invention will be described in more detail through examples, but the following examples are not intended to limit the scope of the present invention, which should be interpreted to aid understanding of the present invention.

MODES OF THE INVENTION

Example 1

200 mL of the TPU solution in which 30 wt. % of thermoplastic polyurethane (TPU) is dissolved in DMF (n,n-dimethylformaldehyde) was prepared. Carbonyl iron powder (CIP, BASF EW) was mixed with the prepared TPU solution at a mass ratio of 2:8, and then, it was mixed in a stirrer at a speed of 2,000 rpm for 5 minutes to prepare a polymer composite.

Next, the prepared polymer composite was cast to a thickness of 100 μm by using a doctor blade to prepare a film, and then, it was dried at 110° C. to remove the DMF solvent. Thereafter, 5 polymer composites were laminated and hot-pressed for 5 minutes at heat of 120° C. and pressure of 10 Mpa to prepare a single film with a thickness of 400 μm.

Next, Ag@Nylon (Soitex) yarn was used as the conductive wire and polyurethane yarn (Myungsung Industry) was used as the upper yarn on the polymer composites that were laminated to a thickness of 400 μm, and the conductive wire was formed with a line width of 250 μm and a spacing of 1.5 mm to manufacture an electromagnetic wave-absorbing composite material.

Examples 2 and 3

An electromagnetic wave-absorbing composite material was manufactured in the same manner as in Example 1, except that the thickness of the polymer composite was changed as shown in Table 1 below.

Examples 4 and 5

Electromagnetic wave-absorbing composite materials were manufactured in the same manner as in Example 1, except that the average line width of the conductive wire was changed as shown in Table 1 below.

Example 6

An electromagnetic wave-absorbing composite material was manufactured in the same manner as in Example 1, except that the average spacing of the conductive wires was changed as shown in Table 1 below.

Example 7

An electromagnetic wave-absorbing composite material was manufactured in the same manner as in Example 1, except that the conductive wires were manufactured to have multiple intervals of 1 mm and 3 mm as shown in FIG. 2d.

Examples 8 and 9

Electromagnetic wave-absorbing composite materials were manufactured in the same manner as in Example 1, except that the conductive wires were manufactured to have a single interval of 1 mm and 3 mm, respectively.

Comparative Examples 1 and 2

Electromagnetic wave-absorbing composite materials were manufactured in the same manner as in Example 1, except that the average spacing of the conductive wires was changed as shown in Table 1 below.

Comparative Examples 3 and 4

Electromagnetic wave-absorbing composite materials were manufactured in the same manner as in Example 1, except that the average refractive index (n) of the polymer composite was changed by adjusting the mass ratios of TPU and CIP, which is a refractive index-adjusting material included in the polymer composite.

Comparative Example 5

An electromagnetic wave-absorbing composite material was manufactured in the same manner as in Example 1, except that the thickness of the polymer composite was changed as shown in Table 1 below:

TABLE 1

|  | Thickness of polymer composite (d, μm) | Refractive index of polymer composite | Average spacing of conductive wires (D, mm) | Average line width of conductive wires (a, μm) | Matching frequency (f1) | Matching frequency (f2) |
|---|---|---|---|---|---|---|
| Example 1 | 400 | 4.13 | 1.5 | 250 | 24.7 | 30.1 |
| Example 2 | 300 | 4.13 | 1.5 | 250 | 25.4 | 31.0 |
| Example 3 | 500 | 4.13 | 1.5 | 250 | 24.3 | 29.7 |
| Example 4 | 400 | 4.13 | 1.5 | 100 | 23.9 | 29.2 |
| Example 5 | 400 | 4.13 | 1.5 | 400 | 25.5 | 31.1 |
| Example 6 | 200 | 4.13 | 5 | 150 | 14.8 | 18.1 |
| Comparative Example 1 | 200 | 4.13 | 0.3 | 150 | 33.4 | 40.8 |
| Comparative Example 2 | 200 | 4.13 | 12 | 250 | 5.1 | 6.3 |
| Comparative Example 3 | 400 | 2 | 1.5 | 250 | 50.7 | 61.9 |
| Comparative Example 4 | 400 | 18 | 1.5 | 250 | 7.3 | 9.0 |
| Comparative Example 5 | 50 | 4.13 | 1.5 | 250 | 40.7 | 49.8 |

Experimental Example 1—Evaluation of Absorption Capacity

In order to evaluate the absorption capacity of the electromagnetic wave-absorbing composite materials manufactured in the examples to comparative examples of Table 1, a vector network analyzer (Keysight N5291A) was used to measure the absorption capacity at the specific frequencies described in Table 2, and the results are shown in Table 2 below.

Experimental Example 2—Evaluation of Reflectivity

In order to evaluate the reflectivity of the electromagnetic wave-absorbing composite materials manufactured in the examples to comparative examples of Table 1, a vector network analyzer (Keysight N5291A) was used to measure the reflectivity at the specific frequencies described in Table 2, and the results are shown in Table 2 below.

Experimental Example 3—Evaluation of Shielding Ability

The comprehensive shielding ability of the electromagnetic wave-absorbing composite materials manufactured in the examples to comparative examples by synthesizing the results according to Experimental Examples 1 to 3 is shown in Table 2 below.

TABLE 2

| | Measurement frequency (GHz) | Reflectivity (db) | Reflectivity (%) | Absorption (dB) | Absorption (%) | Shielding (%) |
|---|---|---|---|---|---|---|
| Example 1 | 26 | 0.01 | 0.2 | 11.22 | 92.2 | 92.4 |
| Example 2 | 26 | 0.2 | 4.5 | 10.65 | 87.3 | 91.8 |
| Example 3 | 26 | 0.13 | 2.9 | 10.99 | 89.3 | 92.2 |
| Example 4 | 26 | 0.11 | 2.5 | 11.45 | 90.5 | 93.0 |
| Example 5 | 26 | 0.18 | 4.1 | 13.25 | 91.4 | 95.5 |
| Example 6 | 18 | 0.01 | 0.2 | 2.03 | 37.3 | 37.48 |
| Comparative Example 1 | 26 | 2.22 | 40.0 | 42.68 | 60 | 100 |
| Comparative Example 2 | 26 | 2.64 | 45.6 | 2.60 | 24.5 | 70.1 |
| Comparative Example 3 | 26 | 2.51 | 43.9 | 10.62 | 51.2 | 95.1 |
| Comparative Example 4 | 26 | 2.81 | 47.6 | 16.07 | 51.1 | 98.7 |
| Comparative Example 5 | 26 | 1.65 | 31.6 | 11.27 | 63.3 | 94.9 |

Experimental Example 4—Evaluation of Reflectivity According to Multi-Interval and Single-Interval Conductive Wires In order to evaluate the reflectivity of the electromagnetic wave-absorbing composite materials according to Examples 7 to 9, it was measured by using a vector network analyzer (Keysight N5291A), and the results are shown in FIGS. 10 and 11.

Referring to Tables 1 and 2 above, through Examples 2 and 3 in which the thickness of the polymer composite was changed in Example 1, it can be seen that the electromagnetic wave-absorbing composite material 100 according to the present invention had a decreased desired target matching frequency band as the thickness d of the polymer composite 10 increased. As a result, it can be seen that the thickness d of the polymer composite 10 is a major factor for determining the matching frequency and absorption capacity of the electromagnetic wave-absorbing composite material 100.

In addition, through Comparative Examples 1 and 2 in which the spacing of the conductive wires was changed in Example 1, it can be seen that a very high reflectivity exceeding 0.2 dB was exhibited compared to Example 1, and the absorption capacity was rather significantly lowered. Accordingly, it can be seen that the spacing D of the conductive wires 30 is a major factor for determining the absorption, reflectivity and shielding ability.

In addition, through Examples 4 and 5 in which the line width of the conductive wire was changed in Example 1, 18 to 40 GHz was exhibited under all of the above conditions of thickness, wire line width and spacing, and at the same time, it can be seen that the reflectivity of each example was less than 0.2 dB. In addition, through Examples 4 and 5, it can be seen that the electromagnetic wave-absorbing composite material 100 according to the present invention can adjust the target matching frequency band by properly designing the line width a of the conductive wire 30, and it can be seen that the line width a of the conductive wire 30 is a major factor for determining the matching frequency and reflectivity.

In addition, through Comparative Examples 3 and 4 in which the average refractive index n of the polymer composite in Example 1 was changed, it can be seen that at the 22.5 GHz measurement frequency as in Example 1, it exhibited a much higher reflectivity than the target reflectivity of 0.2 dB or less as aimed by the present invention. Through this, it was identified that the average refractive index n of the polymer composite as described above is a major factor for determining the matching frequency, reflectivity and absorption capacity, and by controlling the average refractive index n through appropriate design of the thickness d of the polymer composite 10, it is possible to set a desired target matching frequency and design the efficient electromagnetic wave-absorbing composite material.

In addition, it can be seen that unlike Example 1, Example 6 shows only matching frequencies of 14 to 18 GHZ, and unlike Example 1, Comparative Example 5 exhibited a reflectivity that is much higher than the reflectivity of 0.2 dB or less, as aimed by the present invention.

Meanwhile, in the case of the conductive wire 30 having multiple intervals that was manufactured according to Example 7, as shown by solid lines in FIGS. 10 and 11, it can exhibit low reflectivity overall in a wide frequency band. Conversely, in the case of Example 8 (dashed line) or Example 9 (dotted line) of FIGS. 10 and 11 having a single-interval conductive wire, it can be seen that the reflectivity increased rapidly at unmatched frequencies.

Through these results, when only one of the above-described thickness of the polymer composite, the average line width of the conductive wires, and the average spacing thereof does not meet the conditions of the present invention, tit can be seen that it is impossible to have the matching frequency, reflectivity and absorption capacity as aimed by the present invention, and it was identified that through the specific design thereof, it is possible to set a desired matching frequency and design an efficient electromagnetic wave-absorbing composite material.

Furthermore, the present invention has identified that only when the above-described thickness of the polymer composite, the average line width of the conductive wires and the average spacing thereof meet the conditions of the present invention, it is possible to maximize the electromagnetic wave absorption capacity in the target matching frequency band of the electromagnetic wave absorbing-composite material identified through Mathematical Formulas 1 to 3, and the relationship formulas that are capable of designing the organic relationship thereof have been derived, and at the same time, it can be seen that the optimal conditions to maximize the electromagnetic wave absorption capacity that is incident at the set matching frequency have been confirmed.

The invention claimed is:

1. An electromagnetic wave-absorbing composite material, comprising:
   a polymer composite including a refractive index-adjusting material therein; and
   a plurality of conductive wires which are formed on at least one surface of the polymer composite,
   wherein electromagnetic waves reflected in a matching frequency (f) range derived through Mathematical Formulas 1 to 3 below are 0.2 dB or less:

$$0.67 \frac{D_{eff}}{n_{eff}c} \leq f(GHz) \leq 0.83 \frac{D_{eff}}{n_{eff}c} \quad \text{[Mathematical Formula 1]}$$

wherein the lower limit of f is 15, and the upper limit thereof is a frequency of 80,
$D_{eff}$ is the effective spacing of conductive wires represented by Mathematical Formula 2 below,
$N_{eff}$ is the effective refractive index of an electromagnetic wave-shielding composite material represented by Mathematical Formula 3 below, and
c is the speed of light in free space, $$D_{eff}=1.53 \exp(0.23(D-a)) \quad \text{[Mathematical Formula 2]}$$

wherein D is the average spacing of the conductive wires, and
a is the average line width of the conductive wires, $$n_{eff} = \sqrt{1 - \frac{n^2-1}{n^2}\exp\left(\frac{-18d}{D}\right)n} \quad \text{[Mathematical Formula 3]}$$

wherein n is the average refractive index of the polymer composite,
D is the average spacing of the conductive wires, and
d is the thickness of the polymer composite.

2. The electromagnetic wave-absorbing composite material of claim 1, wherein the average spacing (D) of the conductive wires is 0.5 to 10 mm.

3. The electromagnetic wave-absorbing composite material of claim 1, wherein the thickness (d) of the polymer composite is 100 to 2,000 μm.

4. The electromagnetic wave-absorbing composite material of claim 1, wherein the average line width (a) of the conductive wires is 50 to 500 μm.

5. The electromagnetic wave-absorbing composite material of claim 1, wherein the electromagnetic wave-absorbing composite material has an electromagnetic wave absorption rate of 80% or more.

6. The electromagnetic wave-absorbing composite material of claim 1, wherein the refractive index-adjusting material comprises at least one of a magnetic material, a metal material, a carbon material, a ceramic material and MXene.

7. The electromagnetic wave-absorbing composite material of claim 1, wherein the conductive wires comprise at least one of a conductor which is an iron (Fe)-based metal, a cobalt (Co)-based metal, a nickel (Ni)-based metal, a molybdenum (Mo)-based metal, a manganese (Mn)-based metal, a neodymium (Nd)-based metal, a gold (Au)-based metal, a silver (Ag)-based metal, a copper (Cu)-based metal, an aluminum (Al)-based metal, a platinum (Pt)-based metal, a carbon nanotube, a carbon nanofiber, carbon black, a carbon fiber and graphene or a palladium (Pd)-based metal or an alloy thereof, and a conductive polymer which is MXene or polypyrrole, polyaniline, polyacetylene, polyparaphenylenevinylene, polythiophene, polyethylenedioxythiophene, polyphenylene sulfide or a combination thereof.

8. The electromagnetic wave-absorbing composite material of claim 1, wherein a plurality of the polymer composites are laminated, and
   wherein a conductive wire is formed on the uppermost surface of the laminated polymer composite.

9. The electromagnetic wave-absorbing composite material of claim 1, wherein the conductive wires are in the form of a mesh, a circle, a polygon, a split ring or a complex shape including any one or more thereof.

10. The electromagnetic wave-absorbing composite material of claim 1, wherein the conductive wires are formed in multiple intervals or a single interval.

11. The electromagnetic wave-absorbing composite material of claim 10, wherein when the conductive wires are formed in multiple intervals, the conductive wires have a reflectance of 30% or less in frequency.

12. The electromagnetic wave-absorbing composite material of claim 1, wherein the electromagnetic wave-absorbing composite material has an electromagnetic wave reflectance of 0.5 dB or less at a frequency of 26 GHz.

13. The electromagnetic wave-absorbing composite material of claim 1, wherein electromagnetic waves reflected in a matching frequency (f) range derived through Mathematical Formulas 1 to 3 above are 0.1 dB or less.

14. An electromagnetic wave-absorbing circuit module, comprising:
   a circuit board on which elements are mounted; and
   the electromagnetic wave-absorbing composite material according to claim 1 which is provided on the circuit board to cover at least one surface of the elements.

15. An electronic device, comprising the electromagnetic wave-absorbing circuit module according to claim 14.

16. A method for manufacturing an electromagnetic wave-absorbing composite material, comprising the steps of:
   (1) preparing a polymer composite including a refractive index-adjusting material therein; and
   (2) forming a conductive wire on the polymer composite,
   wherein the average refractive index and thickness of the polymer composite and the line width and spacing of the conductive wires are controlled such that electromagnetic waves reflected in a matching frequency (f) range derived through Mathematical Formulas 1 to 3 below are 0.2 dB or less:

$$0.67 \frac{D_{eff}}{n_{eff}c} \leq f(GHz) \leq 0.83 \frac{D_{eff}}{n_{eff}c} \quad \text{[Mathematical Formula 1]}$$

wherein the lower limit of f is 15, and the upper limit thereof is a frequency of 80,
$D_{eff}$ is the effective spacing of conductive wires represented by Mathematical Formula 2 below, $N_{eff}$ is the effective refractive index of an electromagnetic wave-shielding composite material represented by Mathematical Formula 3 below, and c is the speed of light in free space, $$D_{eff}=1.53\ \exp(0.23(D-a))\quad\text{[Mathematical Formula 2]}$$

wherein D is the average spacing of the conductive wires, and a is the average line width of the conductive wires, $$n_{eff}=\sqrt{1-\frac{n^2-1}{n^2}\exp\left(\frac{-18d}{D}\right)n}\quad\text{[Mathematical Formula 3]}$$

wherein n is the average refractive index of the polymer composite,

D is the average spacing of the conductive wires, and d is the thickness of the polymer composite.

17. The method of claim 16, wherein in step (1), a plurality of the polymer composites are laminated, and wherein in step (2), a conductive wire is formed on the polymer composites that are laminated in step (1).

18. The method of claim 16, wherein step (2) is a step of sewing on any one surface of the polymer composite by using the conductive wire which is at least one of a conductor which is an iron (Fe)-based metal, a cobalt (Co)-based metal, a nickel (Ni)-based metal, a molybdenum (Mo)-based metal, a manganese (Mn)-based metal, a neodymium (Nd)-based metal, a gold (Au)-based metal, a silver (Ag)-based metal, a copper (Cu)-based metal, an aluminum (Al)-based metal, a platinum (Pt)-based metal, a carbon nanotube, a carbon nanofiber, carbon black, a carbon fiber and graphene or a palladium (Pd)-based metal or an alloy thereof, and a conductive polymer which is MXene or polypyrrole, polyaniline, polyacetylene, polyparaphenylenevinylene, polythiophene, polyethylenedioxythiophene, polyphenylene sulfide or a combination thereof, and a mixture of fibers including at least one of a polyurethane-based fiber, a polyamide-based fiber, a polyester-based fiber, an acrylic-based fiber, a polyolefin-based fiber, a cellulose-based fiber, a carbon-based fiber and a glass fiber.

* * * * *